(12) United States Patent
Uehara et al.

(10) Patent No.: US 6,380,778 B2
(45) Date of Patent: Apr. 30, 2002

(54) SEMICONDUCTOR INTEGRATED CIRCUIT

(75) Inventors: Yoichi Uehara, Maebashi; Katsumi Yamamoto, Kokubunji, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/840,115

(22) Filed: Apr. 24, 2001

(30) Foreign Application Priority Data

May 12, 2000 (JP) ........................................ 2000-144569

(51) Int. Cl.$^7$ ............................................... H03K 3/017
(52) U.S. Cl. ........................ 327/175; 327/176; 327/165; 327/35
(58) Field of Search ................................ 327/173, 174, 327/175, 176, 165, 166, 31, 35

(56) References Cited

U.S. PATENT DOCUMENTS 5,194,831 A * 3/1993 Jackson ........................ 331/111
5,426,384 A   6/1995 May ............................. 327/52

FOREIGN PATENT DOCUMENTS

| JP | 07-030380 A | 1/1995 |
| JP | 08-088545 A | 4/1996 |
| JP | 7-212224    | 8/1996 |

* cited by examiner

Primary Examiner—Kenneth B. Wells
Assistant Examiner—An T. Luu
(74) Attorney, Agent, or Firm—Reed Smith LLP

(57) ABSTRACT

Even if duty is shifted to either a state in which an "H" period is long or a state in which an "L" period is long, the duty is recovered to about 50%.

A duty correction circuit corrects a duty shift or deviation developed when analog complementary cycle signals having a phase difference of about half cycle therebetween and a duty ratio of about 50% are converted to logic levels, through the use of, for example, serial two-stage NAND gate static latches. The NAND gate static latches perform a latch operation when "H" periods of complementary clock signals are long, thereby to carry out a duty-of-about 50% correction, and perform an invert operation when "L" periods of the complementary clock signals are long, thereby recovering duty to about 50% even with respect to either the state in which the "H" period is long or the state in which the "L" period is long, according to only the levels of the input complementary clock signals and logic operations from timings without outputting narrow or thin pulses equivalent to derivative waveforms due to internal small delays.

22 Claims, 21 Drawing Sheets

FIG. 7(A)
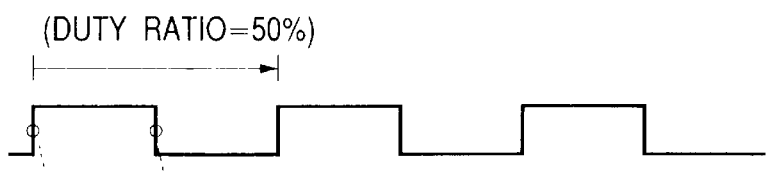
(DUTY RATIO=50%)
FIG. 7(B)
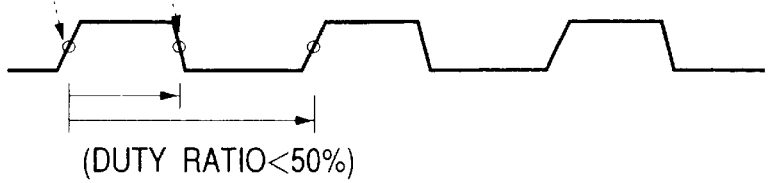
(DUTY RATIO<50%)
FIG. 8
| INPUT 1 | INPUT 2 | OUTPUT 1 | OUTPUT 2 |
|---------|---------|----------|----------|
| H | H | (HOLD STATE EARLIER THAN BEFORE) | |
| H | L | L | H |
| L | H | H | L |
| L | L | H | H(*) |
FIG. 9
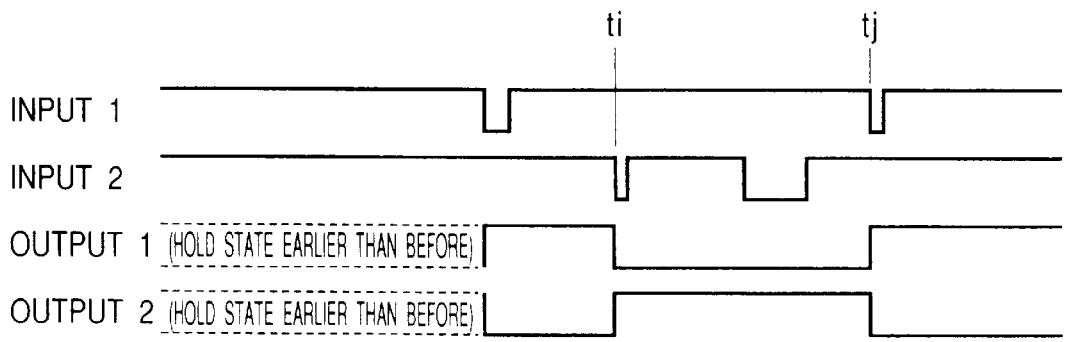
(OPERATION CHART WHERE LATCH OPERATION IS TAKEN)

(OPERATION CHART WHERE ONE INPUT IS FIXED TO L)

(OPERATION CHART WHERE "H" PERIOD IS LONG)

(OPERATION CHART WHERE "L" PERIOD IS LONG)

(OPERATION CHART WHERE "H" PERIOD IS LONG)

(OPERATION CHART WHERE "L" PERIOD IS LONG)

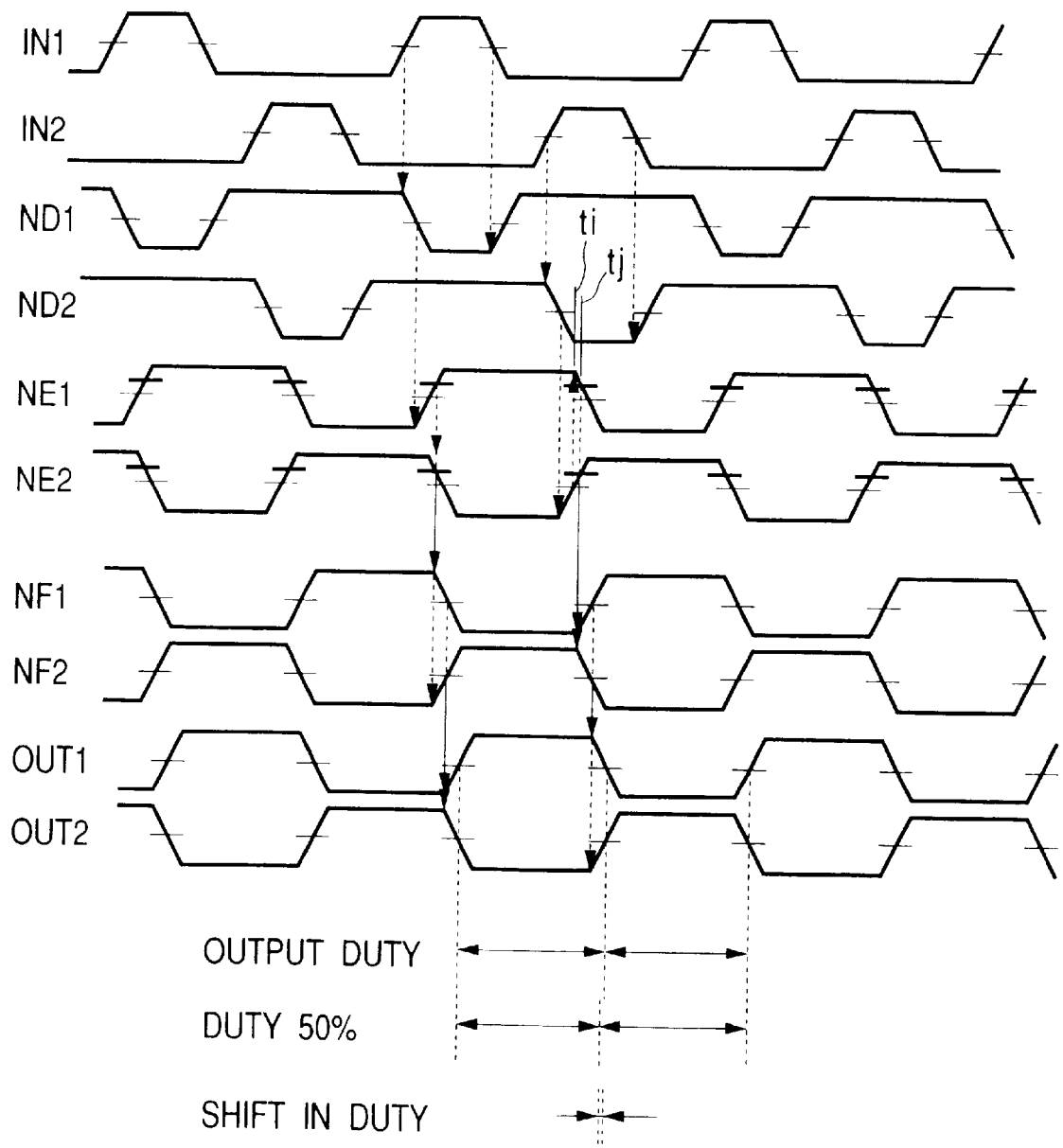

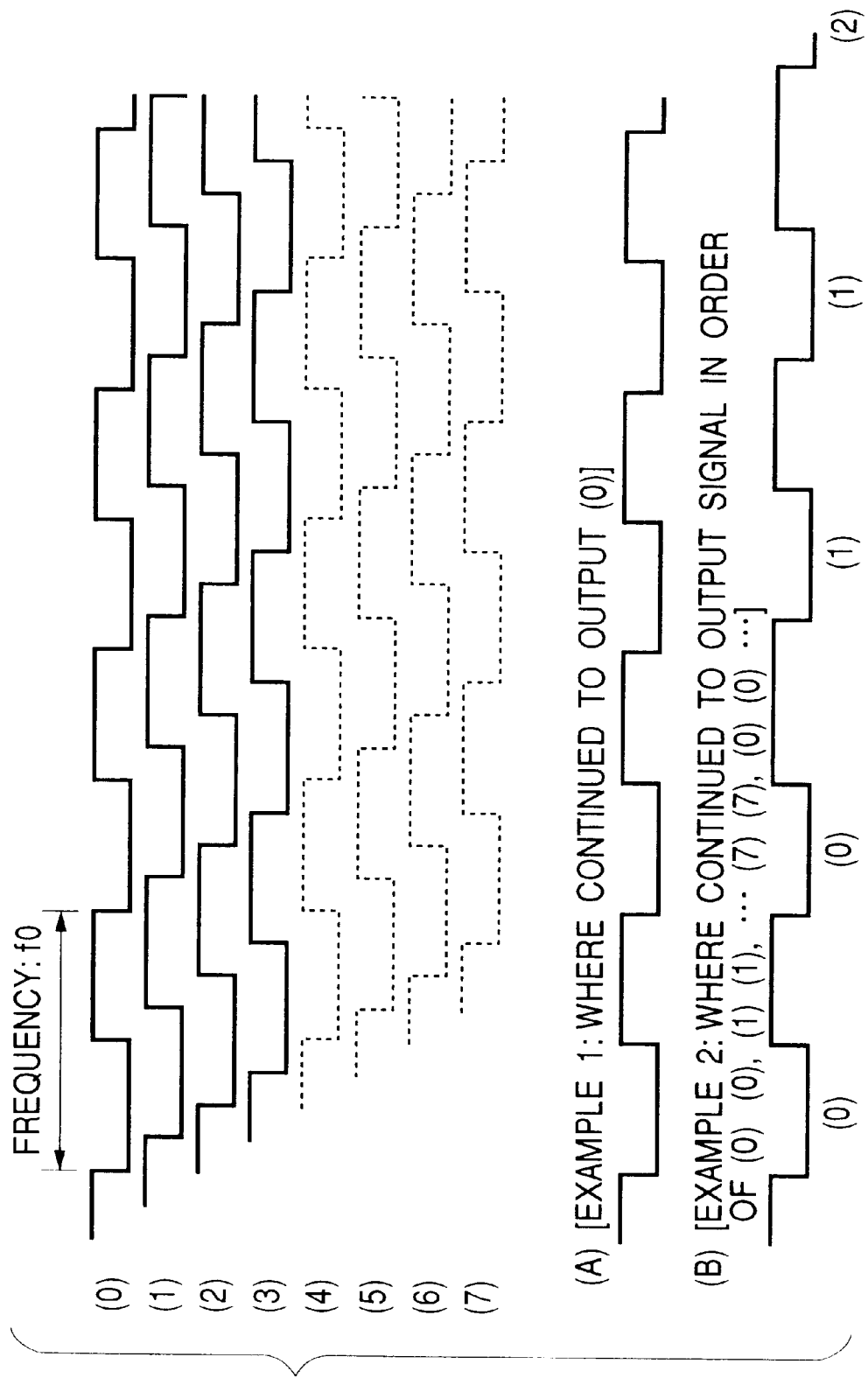

SEMICONDUCTOR INTEGRATED CIRCUIT

BACKGROUND OF THE INVENTION

The present invention relates to a technology of reproducing duty for clock signals so as to lapse into desirable duty by a logic circuit unit operated in synchronism with the clock signals, and to a technology effective for application to a semiconductor integrated circuit.

In a logic circuit comprising a sequence circuit and a combinational circuit, the sequence circuit is normally synchronized with a clock signal to allow a latch operation. In many applications for the logic circuit, the clock signal may preferably be set to a duty ratio of 50% (ratio of high level period to high level and low level periods). In a high-speed operation logic IC, for example, PLL or an oscillator circuit such as a frequency programmable circuit is provided thereinside and each clock is supplied therefrom. Using a differential type circuit as an oscillator circuit such as VCO/ICO or the like makes it possible to generate complementary clock signals whose phase difference/duty ratio are both 50%. However, a duty shift or deviation caused by the difference between a rising propagation delay time tpLH of each clock signal and a falling propagation delay time tpHL thereof is developed in combinational logic provided at a subsequent stage of the oscillator circuit, such as a logic level converter, a clock selection circuit lying inside a logic unit.

The duty shift exerts an influence on the operating speed of the logic circuit. Namely, firstly, the limit of speed-up of a high-speed operation logic circuit is generally determined according to the sum of a delay time for a path (so-called critical path) in which a value obtained by adding (add-subtract calculation) a delay time developed from a clock signal input terminal of a flip-flop to data input terminals of subsequent-stage combinational logic and a next-stage flip-flop via the output of data of the flip-flop, the time required to set up the input of data of the flip-flop on the next-stage side, and a clock skew reaches a maximum within the logic circuit, etc. This value corresponds to a minimum value (maximum value as an operating frequency) determined with respect to the cycle of a clock pulse.

Secondly in addition to the above, operable minimum values are respectively included in an "H" (high level)" width and an "L" (low level) width of a clock input waveform of each flip-flop. When a duty ratio for clocks is shifted from 50%, a high-speed operation limit might be determined in advance in terms of a clock width. This value corresponds to a minimum value determined with respect to each of the "H" and "L" widths other than the cycle of the clock pulse.

The duty ratio for the clock signals is determined according to both the configuration of a clock generator and a shift between tpLH and tpHL in a logic circuit provided at a stage subsequent to the clock generator.

After the invention of the present application has been completed by the present inventors, the present inventors have recognized the presence of first through third Laid-Open Publications. Japanese Patent Application Laid-Open No. Hei 7(1995)-30380 corresponding to the first Laid-Open Publication describes a latch technology of avoiding mistransmission of data between a master latch and a slave latch controlled by quarter-phase clock signals. Japanese Patent Application Laid-Open No. Hei 8(1996)-88545 corresponding to the second Laid-Open Publication describes a technology of transmitting pulse signals inputted to a buffer to a subsequent stage without disturbing a duty ratio. In the present disclosure, a duty ratio correction circuit comprises a series-connected circuit comprised of an edge detection circuit and a latch circuit. Japanese Patent Application Laid-Open No. Hei 7(1995)-21222 corresponding to the third Laid-Open Publication describes a voltage-controlled oscillator which forms an output having a duty ratio of 50%.

In third Laid-Open Publication in particular, differential frequency signals obtained by charging and discharging capacitive elements connected to differential analog input terminals are compared with each other and complementary analog signals are formed from the result of comparison. A latch circuit in which a pair of NAND gates is cross-connected, is used in serial two stages to thereby waveform-shape the complementary analog signals. A delay corresponding to a one-stage gate is developed between the waveform-shaped complementary clock signals. The waveform-shaped complementary clock signals are inputted to a two-input NAND gate. A clock having a narrow width equivalent to the gate delay developed between the input complementary clock signals is formed at the output of the two-input NAND gate. It is divided into two to thereby form clock signals having a duty ratio of 50%. The complementary outputs from the final stages of the serial two-stage latch circuits are fed back to complementarily activate switch circuits for charging and discharging the capacitive elements. In this configuration, the NAND-gate based latch circuits placed in the serial two stages aim to receive an analog output of a comparator and waveform-shape the analog output. Further, the waveform-shaped complementary outputs are fed back as complementary switch control signals for current switch circuits for charging and discharging the capacitive elements placed on the input side of the comparator. Therefore, the serial two-stage NAND latch circuits cannot be formed as components capable of being separated and grasped from the feedback system.

SUMMARY OF THE INVENTION

It is desirable that a duty ratio for clocks is close to 50% to take a high-speed operation margin or increase the maximum operating frequency. It is also desirable that when a duty ratio of 50% takes place at a given node, the difference between tpLH and tpHL is nonexistent at its subsequent stage where practicable. In other words, it has been revealed by the present inventors that it is desirable that the duty ratio of 50% can be achieved at a subsequent stage, i.e., at a clock input terminal of each flip-flop where practicable.

It is considered that in order to achieve the duty ratio of 50% to the utmost, for example, the oscillating frequency is set twice and divided into two by a logic circuit corresponding to a subsequent stage. However, in a high-speed operated application like a read channel LSI such as HDD (Hard Disc Drive), DVD (Digital Video Disc) or the like, the setting of the oscillating frequency to further twice is realistically difficult and undesirable in terms of power consumption and EMI (Electromagnetic Interference).

An object of the present invention is to provide a duty recovery or restoring technology capable of easily recovering a duty ratio for clock signals to a duty ratio of about 50% corresponding to a desirable state in the neighborhood of a sequence circuit even if the duty ratio for the clock signals breaks down at a logic circuit unit which inputs complementary clock signals and performs a logic operation, and a semiconductor integrated circuit to which the technology is applied.

Another object of the present invention is to provide a duty recovery technology capable of easily recovering a duty ratio for clock signals to a state of a desirable about 50% even if the duty ratio for the clock signals increases or decreases from about 50%, and a semiconductor integrated circuit to which the technology is applied.

The above, other objects and novel features of the present invention will become apparent from the description of the present specification and the accompanying drawings.

Summaries of typical ones of the inventions disclosed in the present application will be described in brief as follows:

[1] According to a first aspect of the present invention, serial two-stage static latches are used to correct duty. Namely, a semiconductor integrated circuit has an oscillator circuit (2) which generates complementary cycle signals having a phase difference of about half cycle therebetween and having a duty ratio of about 50%, an output converter (3) which converts the complementary cycle signals outputted from the oscillator circuit to predetermined logic levels and outputs complementary clock signals having a phase difference of about half cycle therebetween, and a logic circuit unit (4) which inputs the complementary clock signals outputted from the output converter and performs a logic operation. The logic circuit unit includes a duty correction circuit (5) which corrects at least a duty shift between the complementary clock signals, which is developed at the output converter, and recovers the same to about 50%. The duty correction circuit has a first logic stage (44, 45) which inputs the complementary clock signals having passed the output converter, and a second logic stage (45, 55) which inputs the output of the first logic stage. The first logic stage performs a logic operation for correcting complementary clock signals having a duty ratio set to be shorter than a period for a first logical value at a duty ratio at which the period for the first logical value is about 50%, to a duty ratio of about 50%, and correcting the period for the first logical value so as to be shorter than the duty ratio of about 50% with respect to complementary clock signals having a duty ratio set to be longer than the period for the first logical value at the duty ratio at which the period for the first logical value is about 50%. The second logic stage inputs complementary clock signals outputted from the first logic stage, corrects complementary clock signals having a duty ratio set to be shorter than a period for a first logical value at a duty ratio at which the period for the first logical value is about 50%, to a duty ratio of about 50%, effects logical value inversion on complementary clock signals whose duty ratio is about 50%, and produces an output therefrom.

When NAND gates are used, as illustrated in FIG. 1, the first logic stage may be configured as a first NAND latch circuit (44) wherein the outputs of one NAND gates are respectively mutually feedback-connected to inputs of the other NAND gates, and complementary clock signals having the phase difference of about half cycle are supplied to the other inputs of the respective NAND gates. Further, the second logic stage may be configured as a second NAND latch circuit (45) wherein the outputs of one NAND gates are respectively mutually feedback-connected to inputs of the other NAND gates, and the outputs of the NAND gates of the first latch circuit are respectively supplied to the other inputs of the respective NAND gates. According to the configurations, as illustrated in FIG. 13, the first NAND latch circuit effects a latch operation on complementary clock signals long in "H" period to thereby recover a duty ratio for the complementary input clock signals to about 50%. The second NAND latch circuit operates as an inverter with respect to the complementary clock signals recovered to the duty ratio of about 50% and thereby outputs the complementary clock signals recovered to a duty of 50%.

On the other hand, as illustrated in FIG. 14, the first NAND latch circuit effects an inverter operation on complementary clock signals long in "L" period to thereby invert the polarity of each input complementary clock signal. The second NAND latch circuit to which the complementary clock signals whose polarities are reversed by the first NAND latch circuit, effects a latch operation on complementary clock signals long in "H" period, thereby recovering duty for the complementary clock signals to about 50% in a manner similar to the above. Thus, even if duty is shifted to either a state in which an "H" period is long or a state in which an "L" period is long, the duty can be recovered to about 50%. Further, duty can be recovered with relative ease according to only levels of input complementary clock signals and logic operations from timings without outputting narrow or thin pulses equivalent to derivative waveforms due to internal small delays.

When NOR gates are used, as illustrated in FIG. 15, the first logic stage may be configured as a first NOR latch circuit (54) wherein the outputs of one NOR gates are respectively mutually feedback-connected to inputs of the other NOR gates, and complementary clock signals having the phase difference of about half cycle are supplied to the other inputs of the respective NOR gates. The second logic stage may be configured as a second latch circuit (55) wherein the outputs of one NOR gates are respectively mutually feedback-connected to inputs of the other NOR gates, and the outputs of the NOR gates of the first latch circuit are respectively supplied to the other inputs of the respective NOR gates. According to the configurations, the NOR latch circuits effect a latch operation on complementary clock signals long in "L" period and effect an inverter operation on complementary clock signals long in "H" period respectively. The polarities of the clock signals are set in reverse as compared with the NAND latch circuits. However, the duty for the complementary clock signals is recovered to about 50% as a result.

Since the NAND latch circuits or the NOR latch circuits have static latch forms respectively, a duty shift equivalent to a delay corresponding to a gate one-stage takes place. As means for reducing the duty shift to the utmost, inverters whose logic threshold voltages are respectively set high from an intermediate level of a source voltage, may be connected to their corresponding outputs of the second latch circuit (each of second NAND latch circuit and second NOR latch circuit) in the case of the NAND latch circuit. In the case of the NOR latch circuit, inverters whose logic threshold voltages are respectively set low from an intermediate level of a source voltage, may be connected to their corresponding outputs of the second latch circuit. Alternatively, the logic threshold voltages of the NAND gates of the first and second latch circuits (44, 45) may be set low from the intermediate level of the source voltage. Further, the logic threshold voltages of the NOR gates of the first and second latch circuits (54, 55) may be set high from the intermediate level of the source voltage.

The duty shift is developed even in each clock control logic circuit for controlling the selection of go clocks, the stop of the supply thereof, etc. When the duty shift developed therein is also an object to be recovered, the complementary clock signals having the phase difference of about half cycle may be supplied to their corresponding inputs of the first latch circuits (44, 54) through the clock control logic circuits (56A, 56B) respectively. In brief, a duty correction circuit is placed in the vicinity of flip-flops of a logic circuit unit.

[2] A second aspect of the present invention aims to perform the extraction of a short "H" period in each of complementary clock signals, or the extraction of a short "L" period therein and the reversal thereof, or perform the extraction of a short "L" period or the extraction of a short "H" period and the reversal thereof in reverse, thereby to achieve the recovery of a duty of about 50%. Namely, a semiconductor integrated circuit has an oscillator circuit which generates complementary cycle signals having a phase difference of about half cycle therebetween and having a duty ratio of about 50%, an output converter which converts the complementary cycle signals outputted from the oscillator circuit to predetermined logic levels and outputs complementary clock signals having a phase difference of about half cycle therebetween, and a logic circuit unit which inputs the complementary clock signals outputted from the output converter and performs a logic operation. The logic circuit unit includes a duty correction circuit which corrects a duty shift between the complementary clock signals, which is developed at the output converter, and recovers the same to about 50%. As illustrated in FIG. 27, the duty correction circuit includes a first logic stage (110) which performs a logic operation for determining a duty ratio for the complementary clock signals, maintaining a period for a first logical value so as to be shorter than a duty ratio of about 50% with respect to complementary clock signals having a duty ratio set to be shorter than the period for the first logical value at a duty ratio at which the period for the first logical value is about 50%, and correcting the period for the first logical value so as to be shorter than the duty ratio of about 50% with respect to complementary clock signals having a duty ratio set to be longer than the period for the first logical value at the duty ratio at which the period for the first logical value is about 50%, and a second logic stage (111) which inputs the complementary clock signals outputted from the first logic stage, effects a correction for setting a duty ratio to about 50% thereon and produces an output therefrom.

According to a specific form of the duty correction circuit, a first logic stage includes a first NAND gate (70) which inputs one of complementary clock signals being a phase difference of about half cycle therebetween and an inverted signal of the other thereof, and a second NAND gate (71) which inputs the other of the complementary clock signals being the phase difference of about half cycle therebetween and an inverted signal of the one thereof. A second logic stage includes a first conduction type first transistor (72) switch-controlled by the output of the first NAND gate and connected to a source voltage and an output terminal, and a second conduction type second transistor (73) switch-controlled by an inverted signal of the output of the second NAND gate and connected to a circuit's ground voltage and the output terminal. A capacitor (74) is connected to the output terminal. The capacitor (74) makes use of only parasitic capacitance, and elements might not demonstratively be laid out on the layout of the semiconductor integrated circuit. However, it is identical in operation to the case where the capacitance is demonstratively provided.

As illustrated in FIG. 30, a NAND latch circuit wherein the output of one NAND gate (78) is mutually feedback-connected to the input of the other NAND gate (79), and the output signals of the first and second NAND gates are respectively supplied to the other inputs of the respective NAND gates, may be adopted as the second logic stage. At this time, the capacitance is not essential.

[3] A semiconductor integrated circuit according to a third aspect of the present invention has an oscillator circuit which generates complementary cycle signals having a phase difference of about half cycle therebetween and having a duty ratio of about 50%, an output converter which converts the complementary cycle signals outputted from the oscillator circuit to predetermined logic levels and outputs complementary clock signals having a phase difference of about half cycle therebetween, and a logic circuit unit which inputs the complementary clock signals outputted from the output converter and performs a logic operation. The logic circuit unit includes a duty correction circuit which corrects a duty shift between the complementary clock signals, which is developed at the output converter, and recovers the same to about 50%. The duty correction circuit includes flip-flops (80, 81) which respectively divide complementary clock signals having a phase difference of about half cycle therebetween into two, and a logic gate circuit (82) which receives the outputs of the flip-flops as two inputs, brings the clock signals into status changes each time the two inputs coincide or uncoincide, and outputs the state-changed signals therefrom. The oscillator circuit is a voltage-controlled oscillator of a PLL circuit, for example.

[4] According to the invention grasped on a dominant conception basis, which includes both the first and second aspects, a semiconductor integrated circuit has an oscillator circuit which generates complementary cycle signals having a phase difference of about half cycle therebetween and having a duty ratio of about 50%, an output converter which converts the complementary cycle signals outputted from the oscillator circuit to predetermined logic levels and outputs complementary clock signals having a phase difference of about half cycle therebetween, and a logic circuit unit which inputs the complementary clock signals outputted from the output converter and performs a logic operation. The logic circuit unit includes a duty correction circuit which corrects a duty shift between the complementary clock signals, which is developed at the output converter, and recovers the same to about 50%. The duty correction circuit has a first logic stage which inputs the complementary clock signals having passed the output converter, and a second logic stage which inputs the output of the first logic stage. The first logic stage performs a logic operation for determining a duty ratio for the complementary clock signals, correcting complementary clock signals having a duty ratio set to be shorter than a period for a first logical value at a duty ratio at which the period for the first logical value is about 50%, to a duty ratio of about 50% or maintaining the period for the first logical value so as to be shorter than the duty ratio of about 50%, and correcting the period for the first logical value so as to be shorter than the duty ratio of about 50% with respect to complementary clock signals having a duty ratio set to be longer than the period for the first logical value at the duty ratio at which the period for the first logical value is about 50%. The second logic stage inputs complementary clock signals outputted from the first logic stage, brings a duty ratio thereof to about 50% and produces an output therefrom.

BRIEF DESCRIPTION OF THE DRAWINGS

FIG. 7 is a waveform diagram illustrating the manner of a duty shift developed between tpLH and tpHL;

FIG. 8 is a function explanatory diagram of a NAND latch circuit;

FIG. 9 is a waveform diagram illustrating latch operating timings of the NAND latch circuit;

FIG. 23 is an operation waveform diagram of the circuit shown in FIG. 22;

FIG. 38 is a waveform diagram illustrating multiphase clock signals.

DESCRIPTION OF THE PREFERRED EMBODIMENTS

Figure 1:
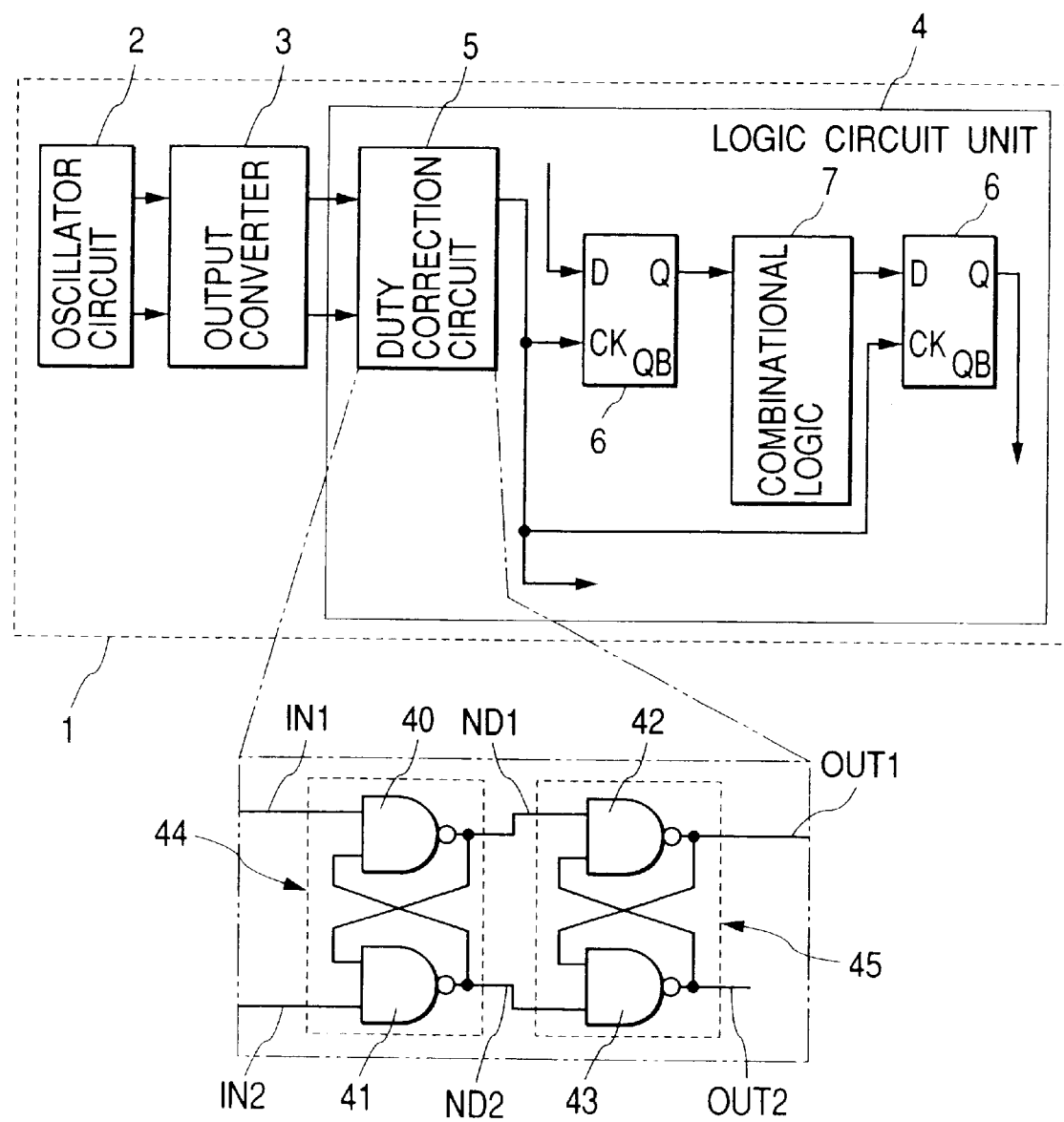
FIG. 1 is an explanatory diagram typically illustrating a clock system employed in a semiconductor integrated circuit according to the present invention.

FIG. 1 shows, as an example, a clock system employed in a semiconductor integrated circuit according to the present invention. The semiconductor integrated circuit 1 has an oscillator circuit 2, an output converter 3, and a logic circuit or logic circuit unit 4. The oscillator circuit 2 generates complementary cycle signals (also called simply "differential signals") whose phase difference is an about half cycle (also called simply "phase difference of 180°") and whose duty ratio is about 50%. The complementary cycle signals are analog signals. The output converter 3 converts the differential signals outputted from the oscillator circuit 2 to predetermined logic levels and thereby outputs complementary clock signals whose phase difference is 180°. The logic circuit 4 receives the complementary clock signals outputted from the output converter 3 therein and performs a logic operation. The logic circuit 4 includes a duty correction circuit 5 for recovering a duty ratio for the complementary clock signals having the phase difference of 180°, which are outputted from the output converter 3, to about 50% even if the duty ratio is shifted or deviated from about 50%, a flip-flop 6 like a typically-shown D latch, and a combinational circuit 7. A clock signal outputted from the duty correction circuit 5 is supplied to, for example, a clock terminal CK of the flip-flop 6. The details of the duty correction circuit 5 will be described later.

Figure 2:
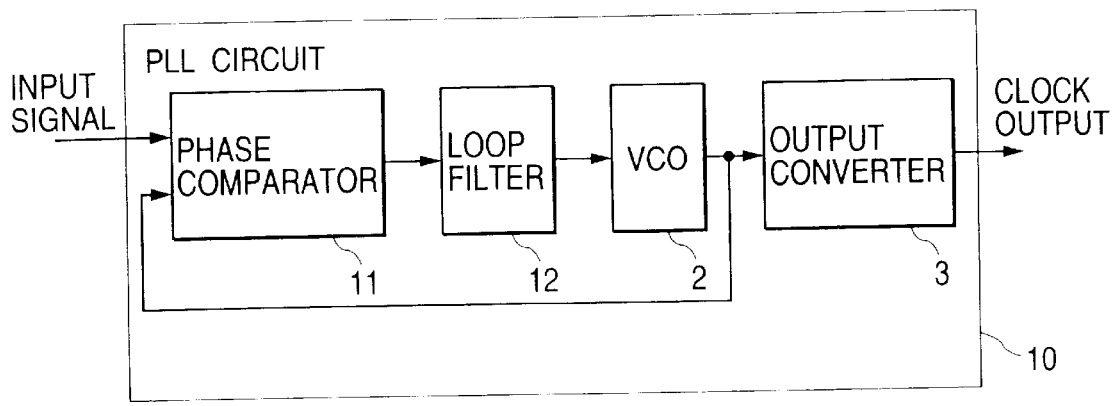
FIG. 2 is a block diagram showing one example of a PLL circuit.
Figure 3:
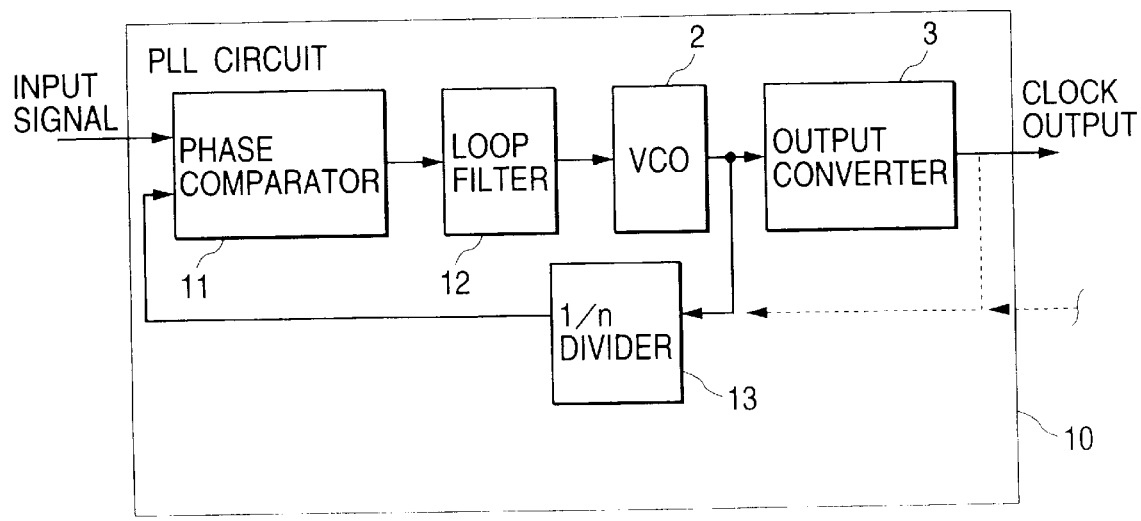
FIG. 3 is a block diagram depicting another example of the PLL circuit.

The oscillator circuit 2 is of, for example, a frequency-variable voltage-controlled oscillator (VCO) or current-controlled oscillator (ICO). Such an oscillator circuit 2 and the output converter 3 are included in, for example, a PLL circuit 10. In the PLL circuit 10 as illustrated in FIG. 2, the oscillation output of the oscillator circuit 2 is fed back to a phase comparator 11 where the phase of the feedback oscillation output and that of an input signal are compared. Further, information about the phase difference is supplied to the oscillation circuit 2 through a loop filter 12. The signal fed back to the phase comparator 11 may not be fed back directly from the oscillator circuit 2 shown in FIG. 2. Alternatively, the signal may be fed back from the output of an output converter 3 or a logic circuit unit 4 corresponding to a further subsequent stage as shown in FIG. 3. The oscillation frequency of the oscillator circuit 2 is not limited to an equimultiple of the frequency of the input signal. As shown in FIG. 3, a divider 13 having a division ratio n may be inserted in a feedback path so as to multiply the oscillation frequency of the oscillator circuit 2 by n of the input signal frequency.

Figure 4:
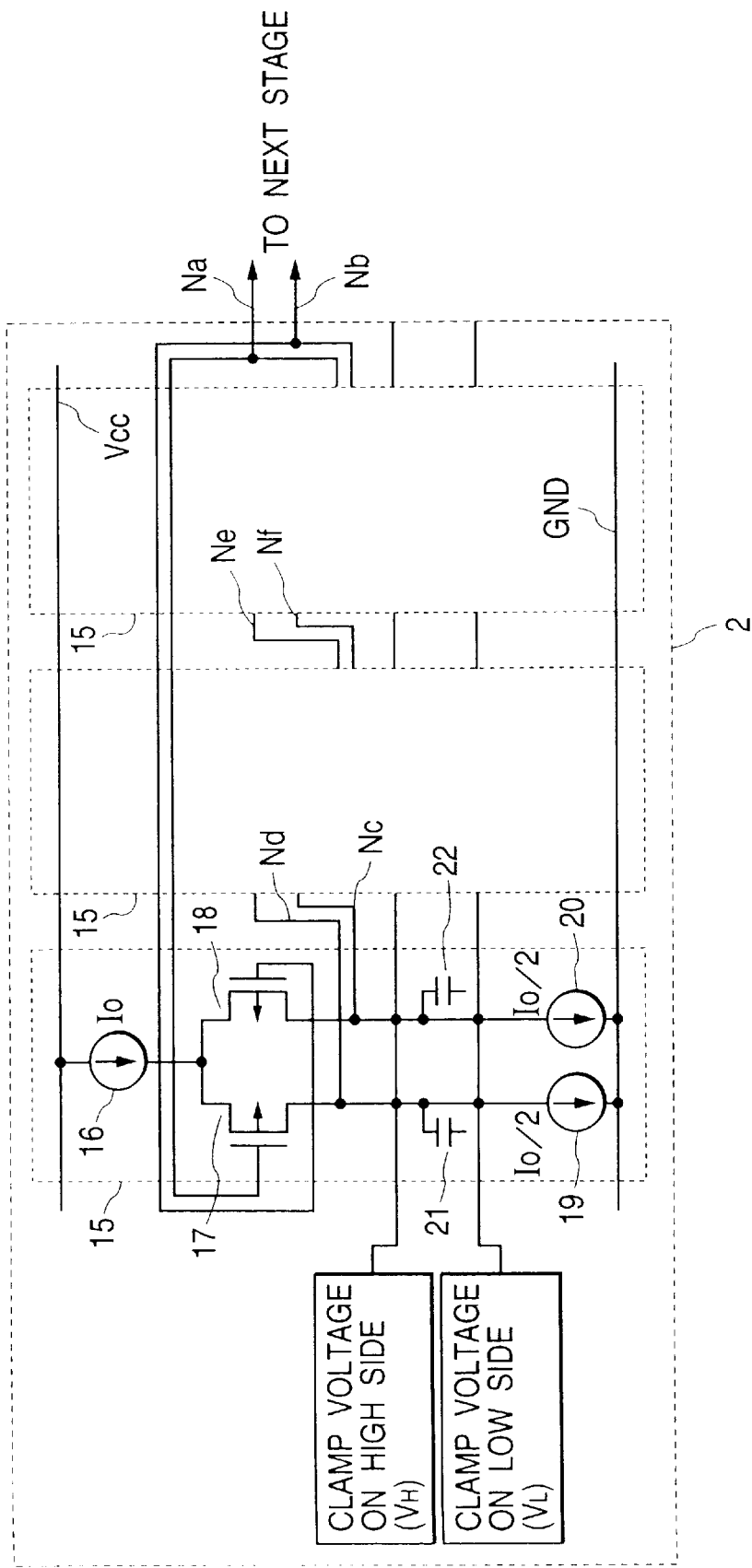
FIG. 4 is a circuit diagram showing one example of an oscillator circuit.

FIG. 4 shows one example of the oscillator circuit 2. The oscillator circuit 2 shown in the same drawing is configured as a ring oscillator by use of feedback-connected differential circuits 15 corresponding to three stages. In each differential circuit 15, the sources of differential input MOS transistors 17 and 18 are commonly connected to a current source 16 supplied with a current $I_0$ from a source voltage Vcc. Further, the drains of the respective MOS transistors 17 and 18 are connected to a circuit's ground potential GND through current sources 19 and 20 each supplied with a current $I_0/2$. Capacitive components 21 and 22 used as delay components are connected to the drains of the MOS transistors 17 and 18. Further, a clamp voltage VH on the high side and a clamp voltage VL on the low side are respectively applied to the drains of the MOS transistors 17 and 18.

Owing to the provision of the differential circuits 15 in further multistage form, an operation staying time increases with the clamp voltages VH and VL and hence the stability of the oscillating operation is improved. The three stages corresponding to the less number of stages becomes highest in maximum oscillation frequency. While FIG. 4 shows the configuration wherein the p channel MOS transistors are used as the differential input MOS transistors 17 and 18, a configuration in which n channel MOS transistors are used as the MOS transistors 17 and 18, or a configuration in which bipolar transistors (NPN and PNP) are used as them, may be used. The capacitive components 21 and 22 make use of only parasitic capacitances, and elements might not demonstratively be laid out on the layout of the semiconductor integrated circuit. However, the capacitive components 21 and 22 are identical in operation as the case where the capacitances are demonstratively provided.

When each of the current sources 19 and 20 is made up of a current mirror circuit comprised of n channel MOS transistors, a VDS (corresponding to a drain-source voltage) at the time that currents flowing through the drains of the n channel MOS transistors are zero, results in a substantially zero voltage. If attention is given to it even from the viewpoint of a good pairing characteristic, then the present circuit is similarly operated even if a circuit for generating the clamp voltage VL on the low side is omitted. When the polarity of the conduction type of MOS transistor is exchanged with that of the source or power supply in the configuration shown in FIG. 4, a circuit for generating the clamp voltage VH on the high side may be omitted.

Varying the current $I_0$ of the current source 16 and the currents $I_0/2$ of the current sources 19 and 20 in association with each other in the configuration shown in FIG. 4 makes it possible to configure the oscillator circuit 2 as a variable-frequency oscillator circuit (ICO). The oscillator circuit 2 can be activated as VCO in the configuration shown in FIG. 4 if the high-side clamp voltage VH or the low-side clamp voltage VL, or both are changed. However, a change in current rather than the change in voltage becomes wide in such a circuit configuration.

Figure 5:
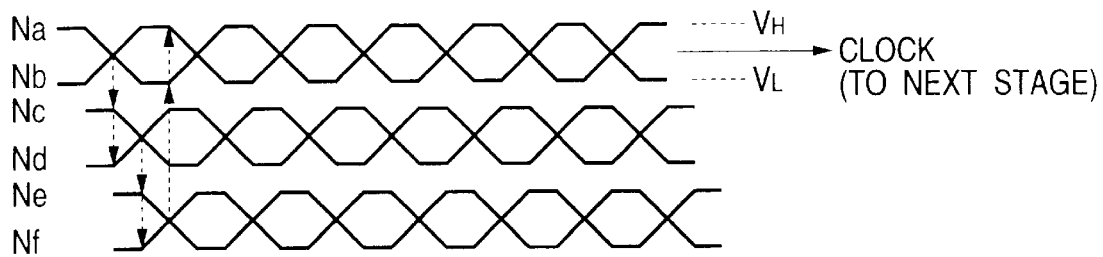
FIG. 5 is a waveform diagram illustrating operation waveforms of the oscillator circuit shown in FIG. 4.

FIG. 5 illustrates operation waveforms of the oscillator circuit 2 shown in FIG. 4. In the circuit configuration shown in FIG. 4, the dynamic range is normally wide where the current is changed. Since the property of pairing of the elements 17, 21 and 19 with the elements 18, 22 and 20 respectively shown on the left and right sides of each differential stage 15 is ensured in this circuit, complementary clock signals obtained at nodes Na and Nb reach a duty ratio of about 50%. A break in duty ratio is only a slight one caused by a pair mismatch between the elements. The difference in phase between the complementary clock signals obtained at the nodes Na and Nb of the oscillator circuit 2 is set to 180°.

Figure 6:
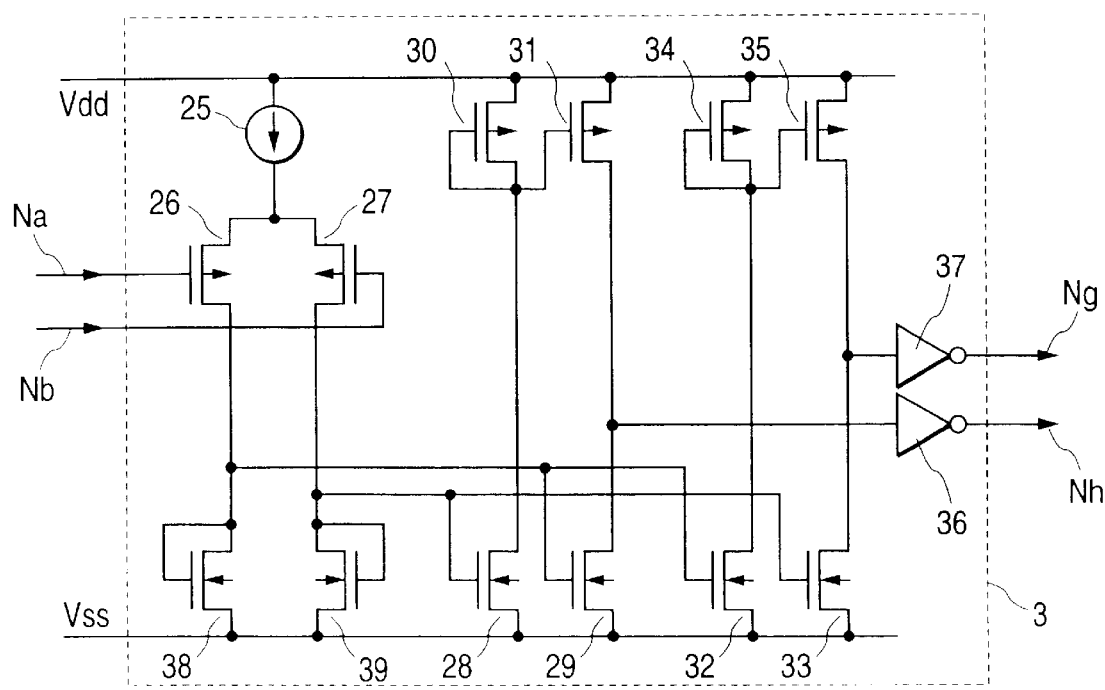
FIG. 6 is a circuit diagram showing one example of an output converter.

FIG. 6 shows one example of the output converter 3. In the output converter 3, the complementary clock signals are respectively supplied from the nodes Na and Nb of the oscillator circuit 2 to their corresponding gates of p channel differential input MOS transistors 26 and 27 whose sources are connected to a constant current source 25. The drains of the differential input MOS transistors 26 and 27 are connected to their corresponding gates of n channel differential input MOS transistors 28 and 29. p channel current mirror load MOS transistors 30 and 31 are respectively provided for the differential input MOS transistors 28 and 29. Similarly, the drains of the differential input MOS transistors 26 and 27 are connected to their corresponding gates of n channel differential input MOS transistors 32 and 33. Further, p channel current mirror load MOS transistors 34 and 35 are provided for the differential input MOS transistors 32 and 33. Owing to the action of a mirror current flowing through each of the load MOS transistors 31 and 35, the drain voltage of the previous-stage load MOS transistor 31 is set so as to be higher than that of the next-stage load MOS transistor 35 at a time at which an Na potential is higher than an Nb potential. At a time at which the Na potential is lower than the Nb potential, the drain voltage of the load MOS transistor 31 is set so as to be lower than that of the next-stage load MOS transistor 35 in reverse. As a result, CMOS inverters 36 and 37 to which the drain voltages of the load MOS transistors 31 and 35 are inputted, output complementary clock signals of CMOS levels to their corresponding nodes Ng and Nh. Operating sources or power supplies for the CMOS inverters 36 and 37 are a source voltage Vdd and a circuit's ground voltage Vss respectively. Incidentally, the transistors designated at numerals 38 and 39 are respectively n channel diode-connected MOS transistors coupled to the drains of the differential input MOS transistors 26 and 27.

The output converter 3 converts the levels of the complementary clock signals each having the oscillated amplitude of the oscillator circuit to their corresponding CMOS levels. When the complementary clock signals now pass through the output converter 3, a difference is developed between tpLH and tpHL, and a duty ratio between the complementary clock signals obtained at the nodes Ng and Nh often deviates from about 50%. The difference between tpLH and tpHL results from the fact that currents flowing through respective current paths when each signal changes from a high level to a low level and form the low to high levels, are different in ratio from one another, and a logic threshold voltage of each CMOS inverter deviates from the center. FIG. 7 shows the manner in which the duty ratio is shifted from 50% due to the former factors, for example. FIG. 7(A) indicates that the duty ratio is 50% and FIG. 7(B) indicates that the duty ratio is shifted from 50% due to the difference between tpLH and tpHL.

<<NAND Latch Serial Two-stage Type Duty Correction Circuit>>

A first example of the duty correction circuit 5 is shown in FIG. 1. The duty correction circuit 5 shown in the same drawing comprises a series circuit of a first NAND latch circuit 44 comprised of NAND gates 40 and 41, and a second NAND latch circuit 45 comprised of NAND gates 42 and 43. In the first NAND latch circuit 44, the outputs of one NAND gates 40 and 41 are respectively mutually feedback-connected to first inputs of the other NAND gates 41 and 40, and the complementary clock signals having the phase difference of 180°, which are delivered from the output converter 3, are supplied to second inputs of the NAND gates 40 and 41. In the second NAND latch circuit 45, the outputs of one NAND gates 42 and 43 are respectively mutually feedback-connected to first inputs of the other NAND gates 43 and 42, and the outputs of the NAND gates 40 and 41 of the first latch circuit are respectively supplied to second inputs of the NAND gates 42 and 43.

The function of the NAND latch circuit will first be described to provide easy understanding of the action or operation of the duty correction circuit shown in FIG. 1. FIG. 8 shows a NAND latch circuit and its truth table. As indicated by a asterisk portion in the truth table of FIG. 8, an output 1 and an output 2 are respectively brought to H in the case of (input 1, input 2)=("L", "L"). However, the outputs are thereafter changed according to the sequence of times at which the inputs 1 and 2 are respectively changed to "H", and when the inputs are both changed to "H" simultaneously, the outputs become undefined. Therefore, the entering of the inputs into (input 1, input 2)=("L", "L") is not normally recommended when it is desired to activate the NAND latch circuit as a latch. Therefore, this is not normally used.

Thus, when the NAND latch circuit is operated as the latch, it is activated in association with such an input combination that only either one (only relatively short time) of the inputs is brought to L with (input 1, input 2)=("H", "H") as a base state as illustrated in FIG. 9.

Figure 10:
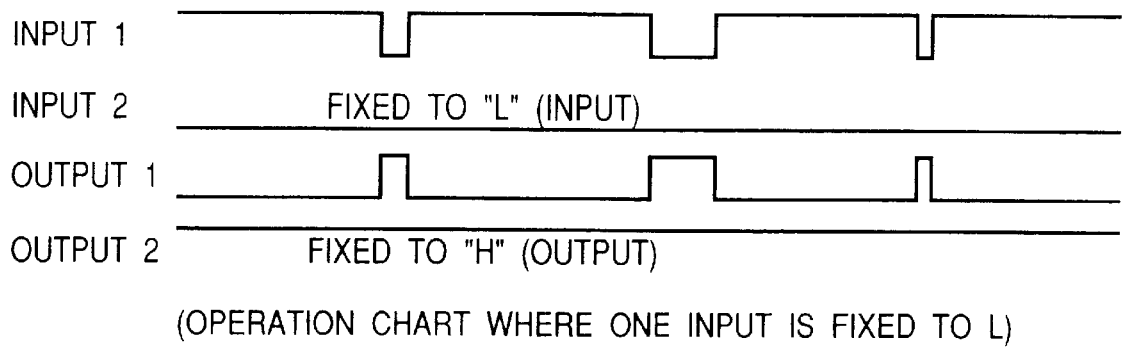
FIG. 10 is a waveform diagram illustrating inverter operating timings of the NAND latch circuit.

On the other hand, how to operate at the time that (input 1, input 2)=("L", "L") is set as the base, changes according to the sequence of the input signals and which meaning should originally be given to the input signals "H"/"L" and output signals "H"/"L" in terms of applications. However, an operation indicative of a relatively simple meaning at the time that one input is fixed to "L", is shown in FIG. 10 as one example of the operation. Since an input 2 is fixed to "L" (input 2="L") in FIG. 10, an output 2 is fixed to "H" and an output 1 is brought to an invert operation of an input 1.

Now consider the above point on a timing basis. When, for example, the input 2 changes from "H"→"L" (time ti), it is understood that in the case of the latch operation shown in FIG. 9, a timing edge signal of the input 2 is transferred to both the outputs 1 and 2 as for the combinations of (input 1, input 2, output 1 set up to now, output 2 set up to now)=("H", "H" (→"L"), "H", "L"). It is similarly understood that when consideration is given to the case where the input 1 changes from "H→"L" (time tj), a timing edge signal of the input 1 is transferred to both the outputs 1 and 2 as for the combinations of (input 1, input 2, output 1 set up to now, output 1 set up to now)=("H" (→"L"), "H", "L", "H").

On the other hand, it is understood that a timing edge signal of the input 1 is transferred to the output 1 as in the case of both "H"→"L" and "L" "H" upon the invert operation shown in FIG. 10.

Since VCO (ICO) performs a differential type analog operation, the oscillator circuit 2 obtains complementary clock signals at two nodes Na and Nb, which satisfy the relationship in which a 180° phase difference exists therebetween and have a duty ratio of about 5%. Namely, the relationship between the timing provided to bring the output of one node Na to "H"→"L" and the timing provided to bring the output of another node Nb to "H"→"L" satisfies about duty 50% under the phase difference of 180°. The duty ratio of about 50% means such a state that an error based on a delay corresponding to one-stage gate in the duty correction circuit 5 is included in the duty 50%, for example.

When the complementary clock signals whose duty ratio is set to about 50%, are inputted to and propagated through the output converter 3 and the logic circuit of the logic circuit unit 4 from the VCO 2, the respective devices in the circuit are different in operation from one another upon transition thereof from "L"→"H" and "H"→"L" and hence tpLH and tpHL differ from each other, whereby a duty shift further occurs in the clock signals whose duty ratio is about 50%. The duty correction circuit 5 combines the "H"→"L" timings provided for the inputs of the respective complementary clock signals substantially having a phase difference of 180° into one signal even if such a duty shift takes place, and restores or recovers the duty ratio of about 50%. This is similar even in the case of the combination of the "L→"H" timings into one signal.

When the above-described result of combination is now outputted based on the combination of the latch operation shown in FIG. 9 and the invert operation shown in FIG. 10, the post-combination output 1 can restore or recover a duty ratio of about 50% if an "H"→"L" timing for an output 1 is obtained from "H"→"L" of an input 2, and in turn an "L"→"H" timing for the output 1 is similarly obtained from "H"→"L" of an input 1. As to an output 2, an "H"→"L" timing for the output 2 is obtained from "H"→"L" of the input 1, and in turn an "L"→"H" timing for the output 2 is similarly obtained from "H"→"L" of the input 2.

Figure 11:
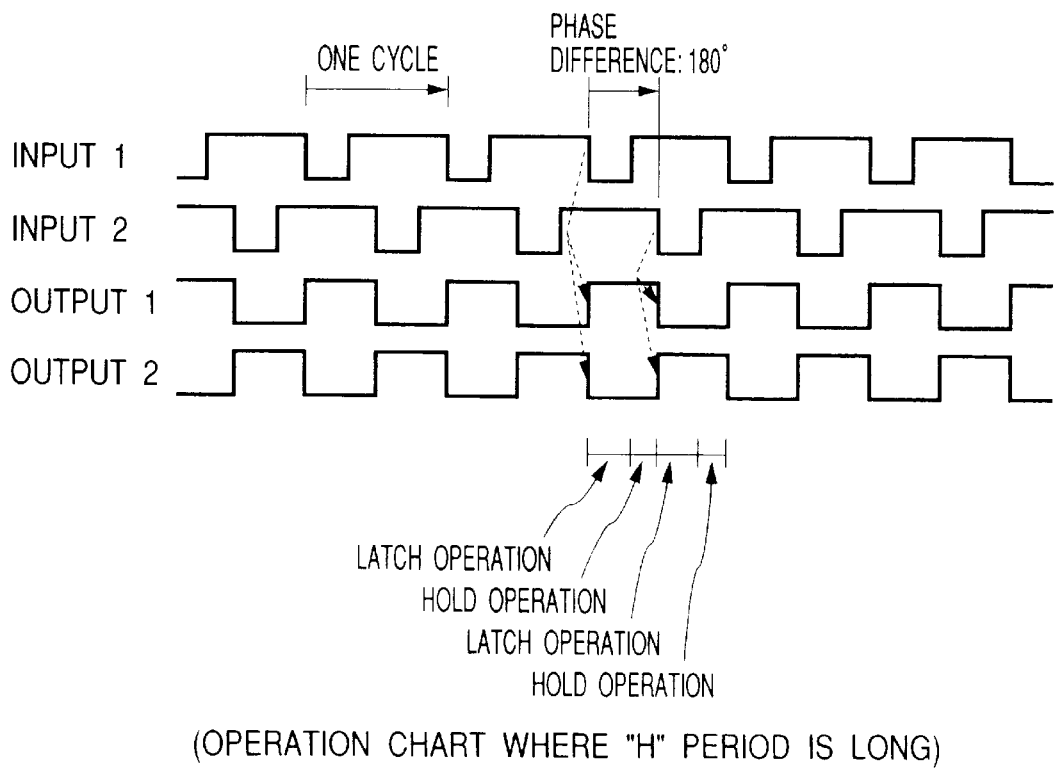
FIG. 11 is an operation waveform diagram at the time that complementary clock signals each having an "H" period longer than an "L" period thereof, are inputted to the NAND latch circuit as a duty ratio.
Figure 12:
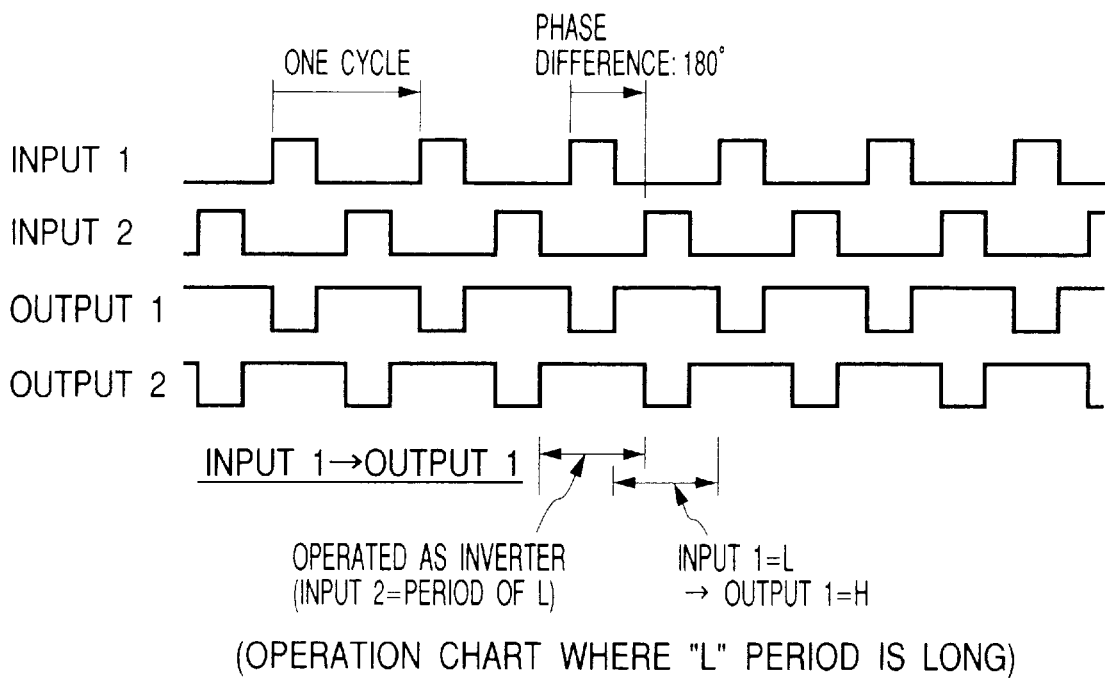
FIG. 12 is an operation waveform diagram at the time that complementary clock signals each having an "L" period longer than an "H" period thereof, are inputted to the NAND latch circuit as a duty ratio.

The operation shown in FIG. 11 is established where the phase difference between inputted complementary signals is about 180° (they are placed in a relationship in which duty 50% is obtained), and each of the two signals has an "H" period long than an "L" period as a duty ratio. In the case of a combination taken under such an input/output condition alone, the operation shown in FIG. 11 is similar to the latch operation. It is however necessary that the complementary clock signals used as the inputs are always respectively controlled to "H" so as to take a long period. On the other hand, an operation example in which the period of "L" is longer than the "H" period, is shown in FIG. 12. Let's take a look at the case of input 1→output 1 where "L" is long. When an input 2 is of "L", a portion at which an input 1→an output 1 is operated as an inverter, exceeds 50% (because the input "L" is long), and in turn the input 1 reaches "L" (thus output 1=H) during the remaining period. Therefore, the input 1→output 1 is eventually operated as the inverter during the whole period. The case of an input 2→an output 2 is also similar to the above, and the input 1/input 2→output 1/output 2 are brought to waveforms similar to the inverter under such an input condition.

Figure 13:
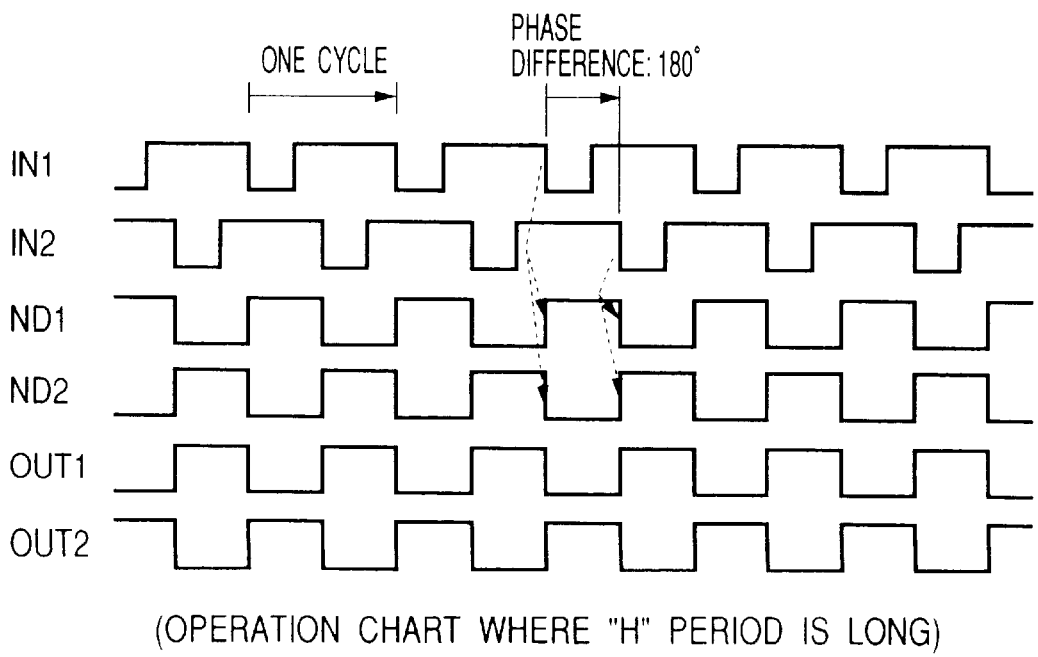
FIG. 13 is a waveform diagram showing a duty correcting operation by two-stage NAND latch circuits where an "H" period is long.

Duty correcting operations executed by serial two-stage NAND latch circuits 44 and 45 will next be described based on FIGS. 13 and 14 with the action or operation of the NAND latch one stage as a base. Clock signals inputted from the output converter 3 to the duty correction circuit 5 are differential clock signals (complementary clock signals) and have a phase difference of 180° therebetween. However, if the duty ratio deviates from about 50%, then an "H" period is long in the case of one of the complementary clock signals placed in a differential relationship. In doing so, an "H" period is similarly long even in the case of the other of the complementary clock signals. When the "H" period is long as shown in FIG. 13 by way of example, a duty ratio of 50% can substantially be restored or recovered in a manner similar to FIG. 11 as in the case of IN1/IN2→ND1/ND2. Once the duty 50% is reached, ND1/ND2 is operated as an inverter even if it passes through the NAND latch circuit 45 corresponding to the second stage like ND1/ND2→OUT1/OUT2, and the polarity thereof is simply reversed. Therefore, the duty ratio is maintained at a duty ratio of about 50%.

On the other hand, attention is given to, for example, IN1→ND1 in IN1/IN2 ND1/ND2 in a manner similar to the operation of FIG. 12. Thus, when the "L" period is long as shown in FIG. 14 by way of example, IN2 is "L" and a portion in which IN1→ND1 is operated as an inverter, exceeds 50% (because the input "L" is long), and in turn the IN1 reaches "L" (thus ND1="H") during the remaining period. Therefore, IN1→ND1 is eventually operated as the inverter during the whole period. The case of IN2→ND2 is similar to the above, and IN1/IN2→ND1/ND2 are brought to waveforms similar to the inverter under such an input condition, which are outputted to ND1/ND2. ND1/ND2 are reversed in polarity. In turn, ND1/ND2 are brought to waveforms in which "H" is long. Further, a phase difference of 180° is developed between the two differential signals. Accordingly, even in the case of such an input condition that the L" period becomes short, a duty ratio of about 50% can be recovered as illustrated in FIG. 14.

Figure 14:
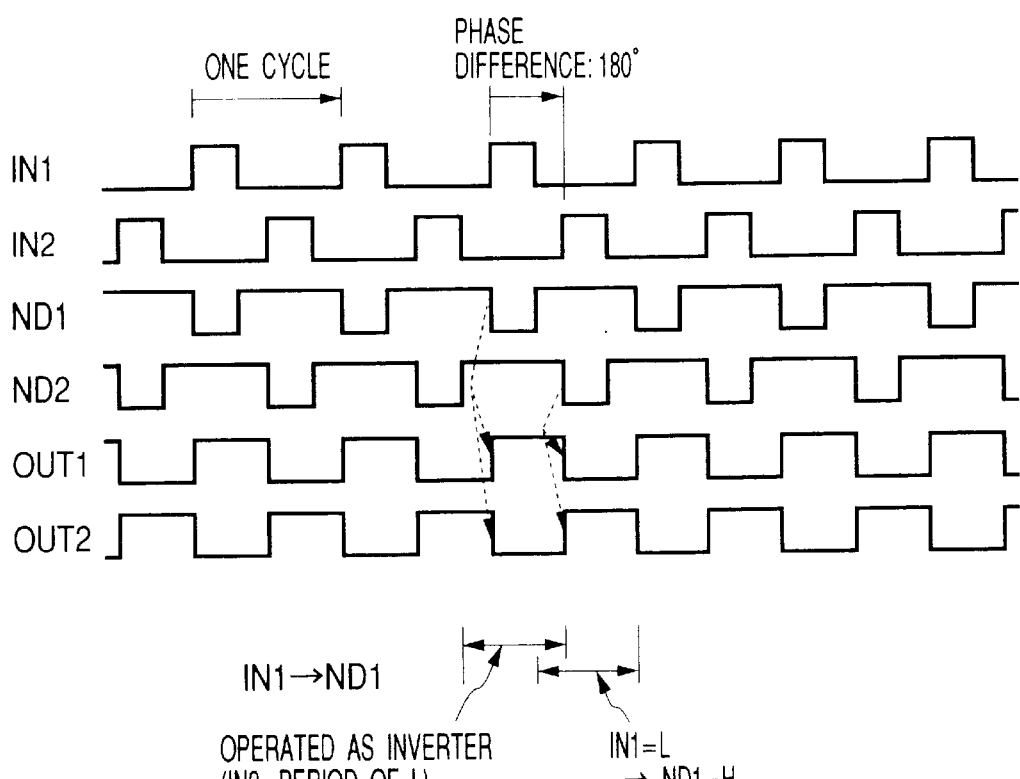
FIG. 14 is a waveform diagram showing a duty correcting operation by the two-stage NAND latch circuits where an "L" period is long.

The outputs OUT1 and OUT2 shown in FIG. 13 and the outputs OUT1 and OUT2 shown in FIG. 14 are respectively reverse edges with respect to edge changes in inputs IN1 and IN2. Even in the case of the inverted edges, no interference occurs because each of the clock signals to be reproduced or corrected is used like a reference clock in the logic circuit unit. When the oscillator circuit 2 constitutes the PLL circuit as shown in FIG. 3, the output OUT1 of the duty correction circuit 5 is fed back to the phase comparator 11 of the PLL circuit, and a predetermined clock signal in phase or out of phase with the output OUT1 is sent to the logic circuit unit corresponding to the subsequent stage, whereby such clock signals that the phase of the output of the duty correction circuit 5 is fixed in a constant phase relation with a reference signal, can be supplied to the logic circuit unit.

The duty ratio for the complementary clock signals supplied from the oscillator circuit 2 is originally set to approximately 50%. Even if it is assumed that the operations of FIG. 13 and FIG. 14 are changed in the course thereof due to jitter and noise, both the complementary clock signals are identical in output waveform to each other because the phase difference therebetween is 180°. Thus, the duty ratio for the output is not degraded more than a slight shift in phase difference due to jitter and noise from the oscillator circuit 2.

<<NOR Latch Serial Two-stage Type Duty Correction Circuit>>

Figure 15:
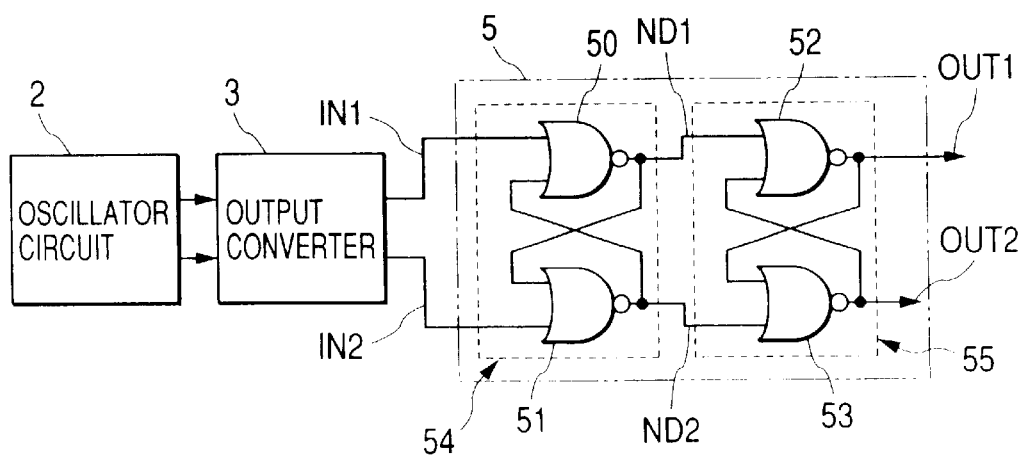
FIG. 15 is a logic circuit diagram showing an example in which a duty correction circuit comprises serial two-stage NOR latch circuits.

A second example of the duty correction circuit 5 is shown in FIG. 15. The duty correction circuit 5 may comprise NOR-gate latches. The duty correction circuit 5 shown in the same drawing comprises a series circuit of a first NOR latch circuit 54 comprised of NOR gates 50 and 51, and a second NOR latch circuit 55 comprised of NOR gates 52 and 53. In the first NOR latch circuit 54, the outputs of one NOR gates 50 and 51 are respectively mutually feedback-connected to first inputs of the other NOR gates 51 and 50, and the complementary clock signals having the phase difference of 180°, which are delivered from the output converter 3, are supplied to second inputs of the NOR gates 50 and 51. In the second NOR latch circuit 55, the outputs of one NOR gates 52 and 53 are respectively mutually feedback-connected to first inputs of the other NOR gates 53 and 52, and the outputs of the NOR gates 50 and 51 of the first NOR latch circuit are respectively supplied to second inputs of the NOR gates 52 and 53.

Figure 16:
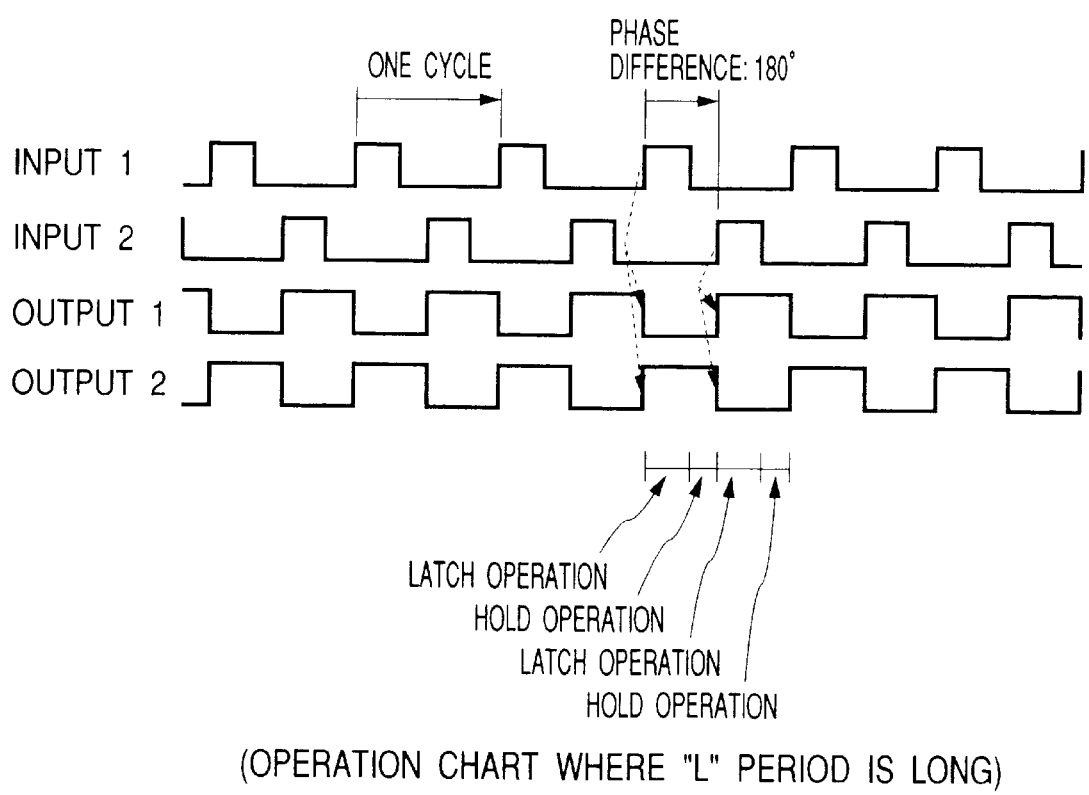
FIG. 16 is an operation waveform diagram of the duty correction circuit shown in FIG. 15 where an "L" period for duty thereof is long.

As is easily analogizable from the description of the NAND latch circuits, the operations of the respective NOR latch circuits 54 and 55 are respectively brought to such latch operations (similar to the description of FIG. 11) as illustrated in FIG. 16 where an "L" period for duty with respect to each of differential input signals is long. When an "H" period for duty with respect to each of the differential input signals is long in reverse, each of the NOR latch circuits functions as an inverter in a manner similar to the description of FIG. 12 although not illustrated in the drawing in particular. Thus, although not shown in the drawing in particular, the duty correction circuit shown in FIG. 15 sets complementary clock signals each having a long "L" period to a duty ratio of about 50% through the use of the NOR latch circuit 54 corresponding to the first stage and inverts the complementary clock signals though the use of the next-stage NOR latch circuit 55 in a manner similar to the case described in FIG. 13, thereby reproducing the complementary clock signals having a phase difference of 180° and set to the duty ratio of about 50%. Although not illustrated in the drawing in particular, the duty correction circuit 5 shown in FIG. 15 inverts complementary clock signals whose "H" periods are long, through the use of the NOR latch circuit 54 corresponding to the first stage and reproduces the complementary clock signals set to a duty ratio of about 50% through the use of the next-stage NOR latch circuit 55 in a manner similar to the case described in FIG. 14.

Even if the duty correction circuit 5 is made up of the NOR latch circuits, it is simply different from the circuit using the NAND latch circuits in that the corresponding polarity is set in reverse. Therefore, a duty correcting function similar to it can be implemented.

<<Preposition of Clock Control Logic>>

In the semiconductor integrated circuit, clock signals normally often pass through a suitable combinational circuit before they are supplied to clock input terminals of respective flip-flops of a logic circuit unit corresponding to a subsequent stage. For example, a combinational circuit is interposed which performs control on the selection and stop/application of clock signals or selective control for changing a division ratio, the selection of a normally used clock signal and an on-test test clock signal, the selection of an internal oscillation clock signal and an external input clock signal, etc. When the values of tpLH and tpHL differ from each other when the clock signals pass through such a combinational circuit, the clock signals transferred to the logic circuit corresponding to the subsequent stage are further shifted in duty ratio correspondingly.

Figure 17:
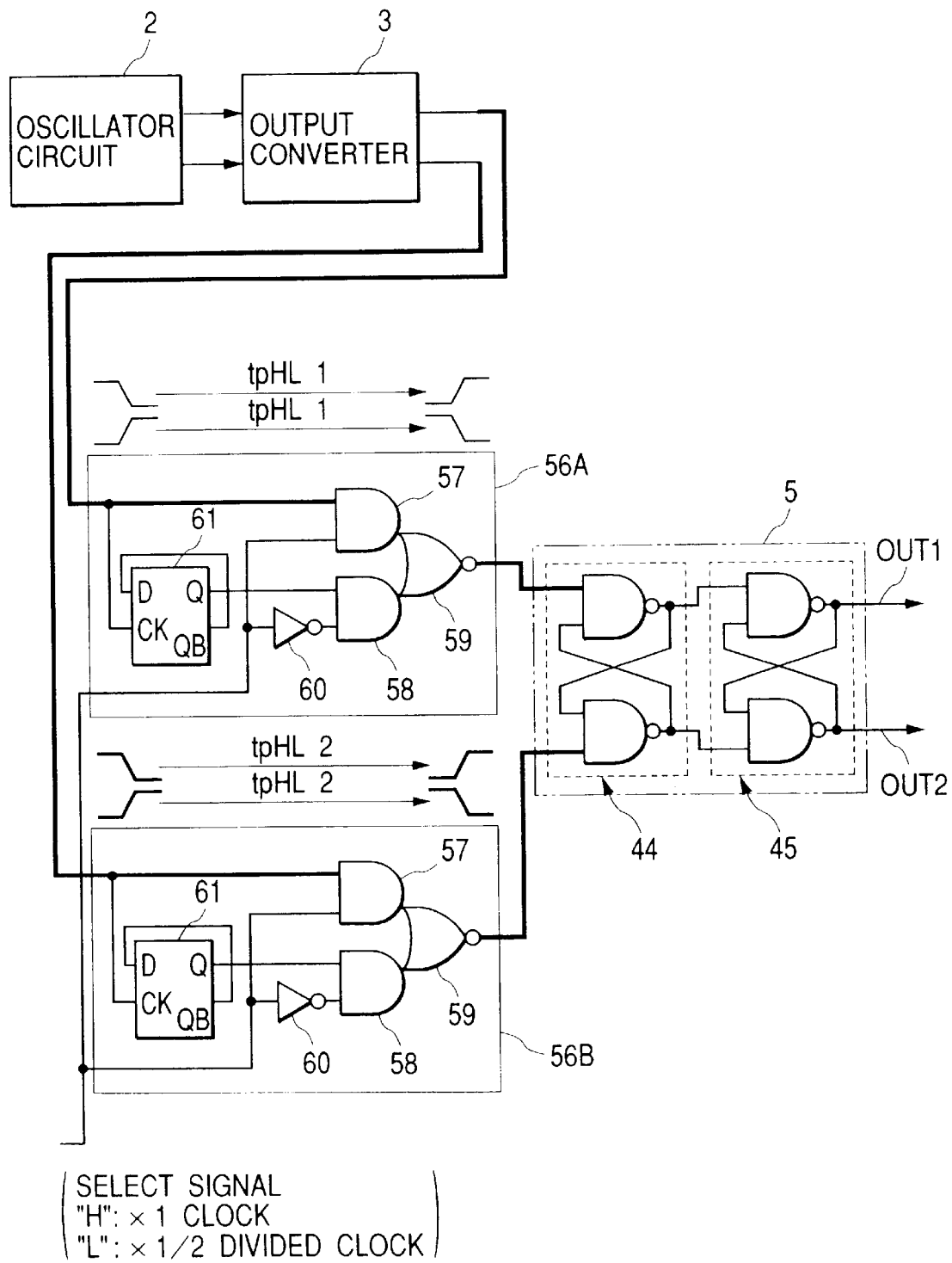
FIG. 17 is a logic circuit diagram showing an example illustrative of clock control logic circuits placed in front of a duty correction circuit.

FIG. 17 shows an example in which clock control logic circuits are placed in front of a duty correction circuit. In the example of FIG. 17, clock control logic circuits 56A and 56B are brought into differential form or dualization and respectively interposed in signal paths or channels for complementary clock signals outputted from an output converter 3. Further, complementary clock signals obtained from the pair of clock control logic circuits 56A and 56B are supplied to the duty correction circuit 5.

In the clock control logic circuit 56A here, a difference between tpLH1 and tpHL1 between an input clock signal delivered from the output converter 3 and an output clock signal sent to the duty correction circuit 5 can be corrected by the duty correction circuit 5. Similarly, a difference between tpLH2 and tpHL2 related to other clock signals can also be corrected. Since these differences or deviations result from the difference between characteristics and operating conditions of devices activated in a circuit, due to the turning on of an n channel MOS transistor upon the other signal transition if a p channel MOS transistor is turned on upon one signal transition, or vice versa, or the setting of the other signal transition to the "L" side even as to a voltage condition if one signal transition is on the "H" side, or vice versa, etc., contrivances are needed when the central values are rendered coincident with each other at a circuit's design stage, and variations also increase. Thus, the effect of performing a duty correction by the duty correction circuit 5 is enhanced.

A difference between tpLH1 and tpLH2 cannot be corrected and hence results in a duty shift in output. A difference between tpHL1 and tpHL2 cannot be corrected either and hence results in a duty shift in output. However, these are differences developed by so-called tpd circuits. If the circuits are designed so as to meet a pair property inclusive of wirings as in the case in which they are treated equally and placed in contiguity with each other in the same shapes in terms of their layout, for example, then these differences can sufficiently be reduced owing to the property of pairing of in-IC devices.

FIG. 17 shows an example of a circuit which corrects a duty shift developed by the difference between tpLH and tpHL of combinational logic for selecting clocks to be outputted to the subsequent stage from ×1 clocks and ×½ divided clocks. In the clock control logic circuits 56A and 56B, AND gates 57 and 58, an OR gate 59 and an inverter 60 constitute a two-input selector. A flip-flop 61 constitutes a divider circuit. In the circuit shown in FIG. 17, the flip-flops 61 are inserted into the clock control logic circuits 56A and 56B. However, no flip-flops are placed in ×1 main paths (corresponding to paths indicated by heavy lines in the drawing) extending from the oscillator circuit 2 to the duty correction circuit 5. As to clock signals on the ×1 main paths, a duty shift developed due to the difference between tpLH and tpHL of combinational logic can be corrected.

Figure 18:
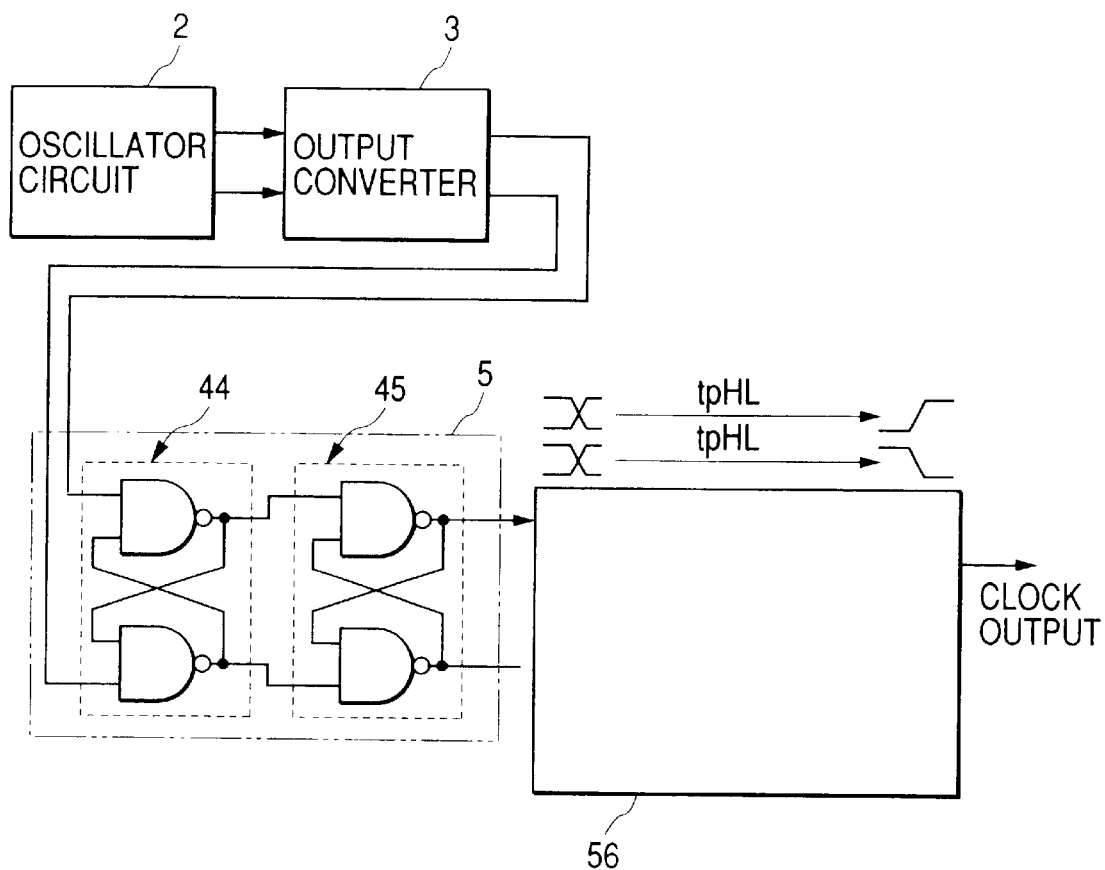
FIG. 18 is a logic circuit diagram showing the state in which a clock control logic circuit is placed in a stage subsequent to a duty correction circuit.

When a clock control logic circuit 56 is placed in a stage subsequent to the duty correction circuit 5 as illustrated in FIG. 18, tpLH and tpHL are different in value from each other due to the clock control logic circuit 56 and a duty shift remains in clock signals.

Figure 19:
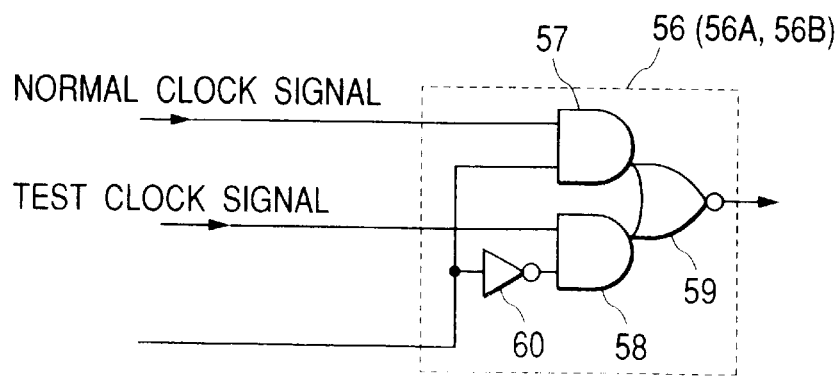
FIG. 19 is a logic circuit diagram showing a selector corresponding to one example of clock control logic.

FIG. 19 shows one example of a selector for alternatively selecting a normal clock signal and a test clock signal. The selector is another example of each of the clock control logic circuits 56A, 56B and 56.

<<Countermeasures Against Duty Shift Due to Gate Delay>>

In the above-described duty correction circuit 5 configured in the NAND latch or NOR latch form, a shift or deviation from the duty ratio of 50% is actually developed by a delay corresponding to one gate due to the feedback connection of gates.

Figure 20:
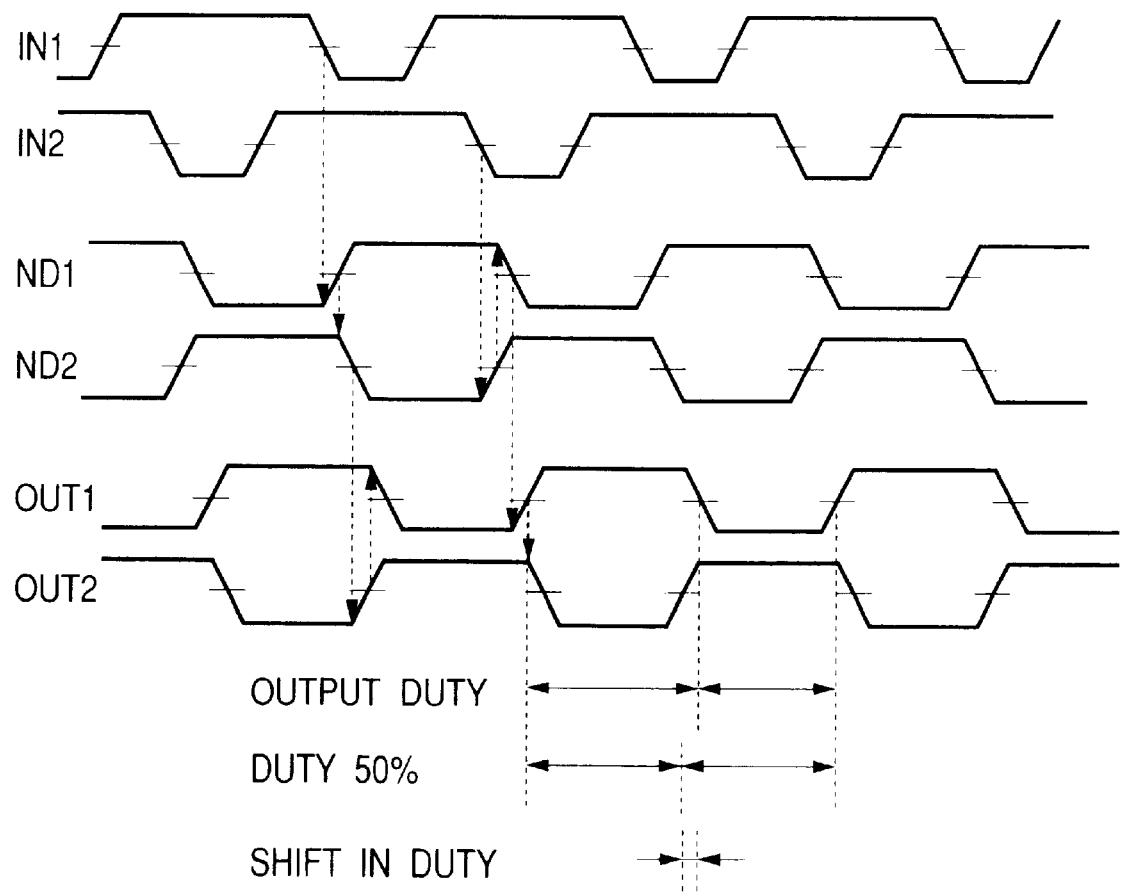
FIG. 20 is an operation signal waveform diagram of a duty correction circuit having given consideration even to a gate delay when complementary clock signals whose "H" are long and having a phase difference of 180° therebetween are inputted in the circuit shown in FIG. 1.

When complementary clock signals whose "H" are long and have a phase difference of 180° therebetween are inputted in the circuit shown in FIG. 1, signal waveforms at the time that a gate delay is also taken into consideration, are shown in FIG. 20. The present drawing shows the case in which tpLH and tpHL are set substantially equal to each other, VLT (logic threshold voltage) is set to the central neighborhood (VLT=(VH+VL)/2) between VH and VL in the circuit, and VLT at an input node of subsequent-stage logic which receives this output, is also set to VLT=(VH+VL)/2. A shift in duty or duty shift is equivalent to a delay time corresponding to one gate with respect to a duty of 50%.

Figure 21:
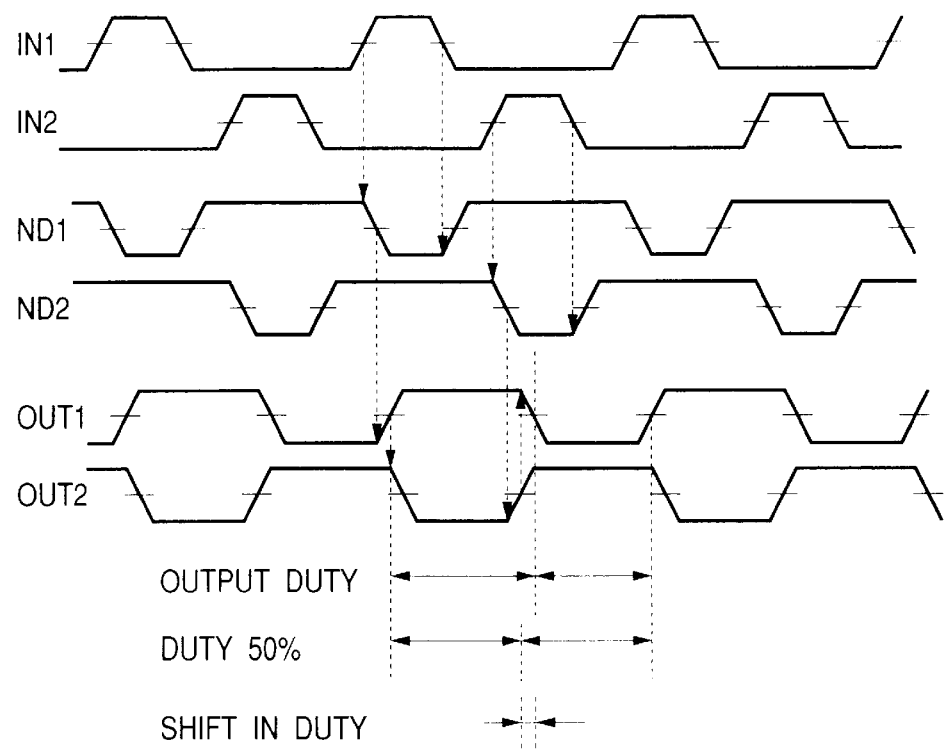
FIG. 21 is an operation signal waveform diagram of a duty correction circuit having given consideration even to a gate delay when complementary clock signals whose "L" are long and having a phase difference of 180° therebetween are inputted in the circuit shown in FIG. 1.

FIG. 21 shows an example in which differential clocks whose "L" periods are long and having a phase difference of 180° therebetween are inputted in the circuit shown in FIG. 1. A duty shift equivalent to a delay time corresponding to one gate is developed similarly even in the present example.

Performance degradation due to the duty shift becomes evident where the frequencies of complementary clock signals increase to some extend or more. It is also considered that in order to ensure a duty ratio of 50% where practicable, VCO/ICO is caused to oscillate at a double frequency and its oscillated output is divided into two. However, since a duty shift is actually developed by a delay corresponding to one gate even in the case of the 2-division circuit, it is considered to be virtually meaningless. While the duty shift can be reduced by contriving a circuit configuration, a circuit system, circuit constant design, and a (logic) layout, there is a limit on it. When an attempt is made to detect and cope with such a duty shift, some kind of detecting means is required. A problem in this case is that to which extent recognition as to whether the central value of the detecting means corresponds just to the duty ratio of 50% or deviates therefrom should be taken.

Figure 22:
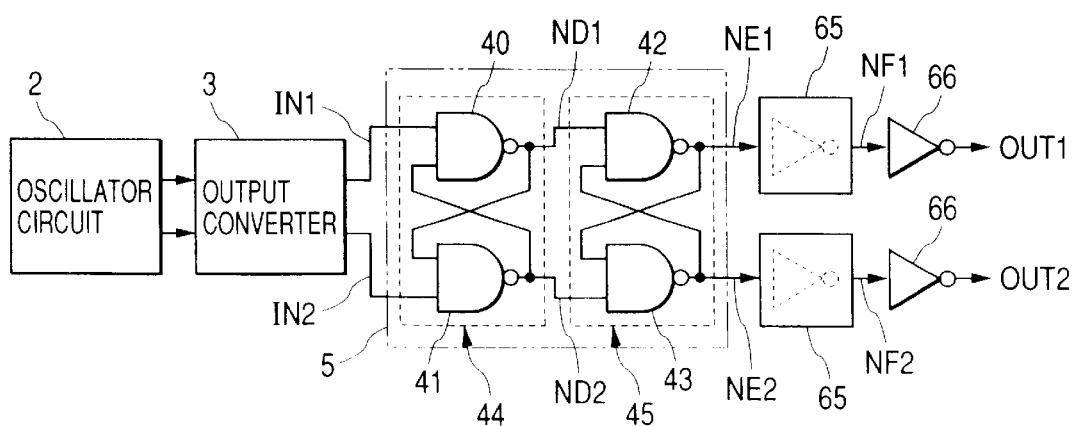
FIG. 22 is a logic circuit diagram depicting a first example of a circuit obtained by taking a countermeasure for a duty shift corresponding to one gate delay against a duty correction circuit.

FIG. 22 shows a first example of a circuit in which countermeasures against the duty shift corresponding to one-gate delay are taken for the duty correction circuit. The countermeasures against the duty shift corresponding to one-gate delay, which are shown in the present example, are taken in that a design central value of tpd of one gate is a design central value corresponding to the duty shift, and the maximum value (the property of pairing of each differential portion with it) of a variation in tpd of one gate results in a factor for determining the maximum value of the duty shift. When a latch 45 and each of inverters 65 different in threshold value are connected to each other, the design central value corresponding to the duty shift is made closer to zero and by extension, the maximum value of its variation is also set so as to be smaller than a deviation or shift from 50%. Namely, the inverters 65 in which VLT (logic threshold voltage) is set high, are placed in a stage subsequent to the duty correction circuit 5. In the example shown in FIG. 22, the output of each inverter 65 is amplified by each of CMOS inverters 66, followed by supply to the subsequent stage as complementary clock signals. FIG. 23 illustrates a waveform diagram at this time. By setting the logic threshold voltage of each inverter 65 high, NE2 exceeds a logic threshold voltage of a NAND gate 42 at a time ti, for example, and a change in NE1 is started. However, the time at which NE2 exceeds the logic threshold voltage of the inverter 65 connected to NF2, is a time subsequent to its time. Afterwards, the logic threshold voltages of the inverters 65 (two) are set in such a manner that NE1 exceeds the logic threshold voltage of the inverter 65 connected to NF1 at a time tj, and the time at which NE2 exceeds the logic threshold voltage of the inverter 65 connected to NF2, substantially coincides with tj, whereby a deviation or shift from the duty ratio of 50% is reduced.

Figure 24A:
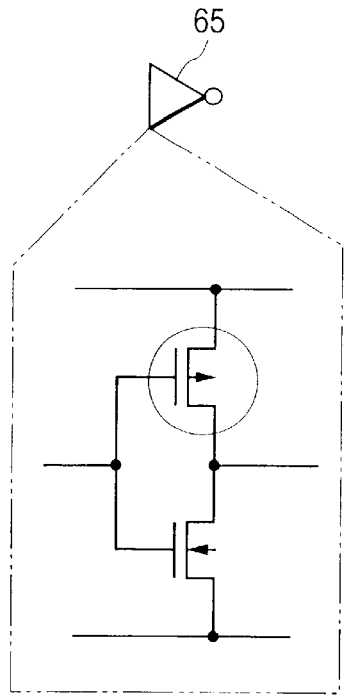
FIG. 24 is a circuit diagram illustrating inverters whose logic threshold voltages are respectively set high from a standard value.
Figure 24B:
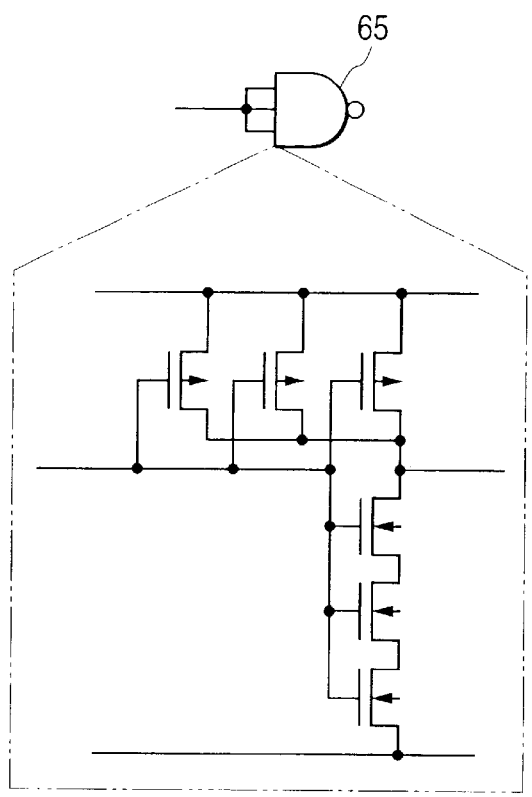

In order to increase the logic threshold voltage from a standard value, the respective threshold voltages of a p channel MOS transistor and an n channel MOS transistor are changed, or a plurality of devices having threshold voltages are prepared in advance and any of them may be selected subsequently. As an alternative to it, the increase in logic threshold voltage can be implemented by changing the ratio between the sizes of the p channel MOS transistor and the n channel MOS transistor even under the condition that device characteristics are identical. Referring to FIG. 24(A), for example, this example is identical to the CMOS inverter in connection, whereas a p channel MOS transistor surrounded by ○ is configured on a larger scale as compared with the ratio between the sizes of a p channel MOS transistor and an n channel MOS transistor for normal inverters. As shown in FIG. 24(B) by way of example, the present example can obtain an effect similar to the case in which the inputs of multi-input NAND gates, e.g., three-input NAND gates are short-circuited to effectively change a transistor size ratio.

The change in the logic threshold voltage may be effected only on the inverter 65 shown in each drawing. A decision about to which extent the change should be made depends on each manufacturing process or the like. Each logic gate in which the transistor size ratio has been changed intentionally in this way, is skewed toward a change in the difference between tpLH and tpHL and an increase in the variation in its delay or delay time difference due to the load imposed thereon. Thus, if, for example, only one inverter 66 is connected close to the next stage of its corresponding gate 65 and thereafter the outputs OUT1 and OUT2 for the subsequent stage are taken out, as illustrated in FIG. 22 where such an addition as described above is made, then a change in delay time difference between the OUT1 and OUT2 can be avoided even if the load on the gate 65 is low and a change in circuit/layout is made.

Figure 25:
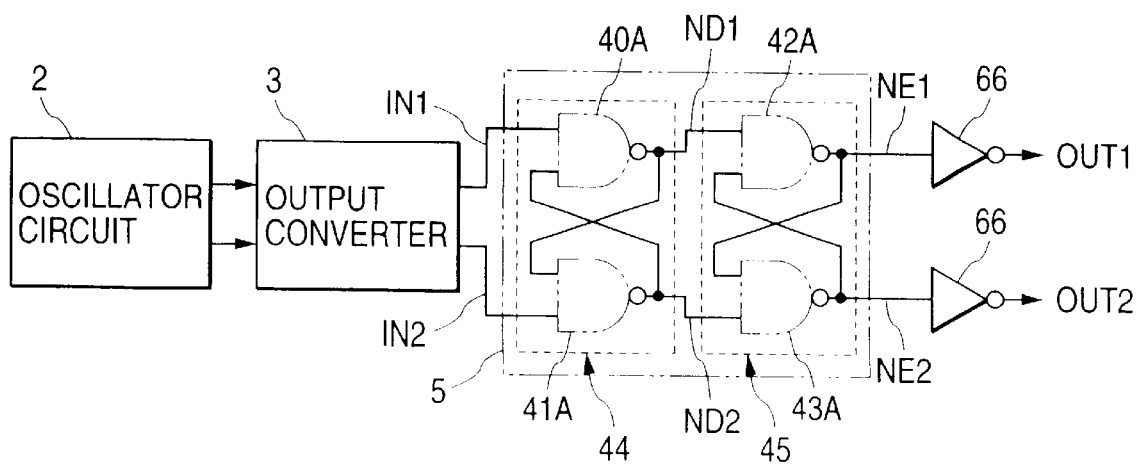
FIG. 25 is a logic circuit diagram showing a second example of a circuit obtained by taking a countermeasure for a duty shift corresponding to one gate delay against a duty correction circuit.

FIG. 25 shows a second example of a circuit in which countermeasures against the duty shift corresponding to one-gate delay are taken for the duty correction circuit. The countermeasures against the duty shift corresponding to one-gate delay, which are shown in the present example, are implemented by lowering logic threshold voltages of NAND gates 40A through 43A constituting NAND latch circuits 44 and 45. In order to reduce the logic threshold voltages, the opposite way may be effected on the above-described increased case on a characteristic basis. However, since the NAND gates are apt to originally increase in logic threshold voltage as is analogizable from FIG. 24(B), attention is required.

Figure 26:
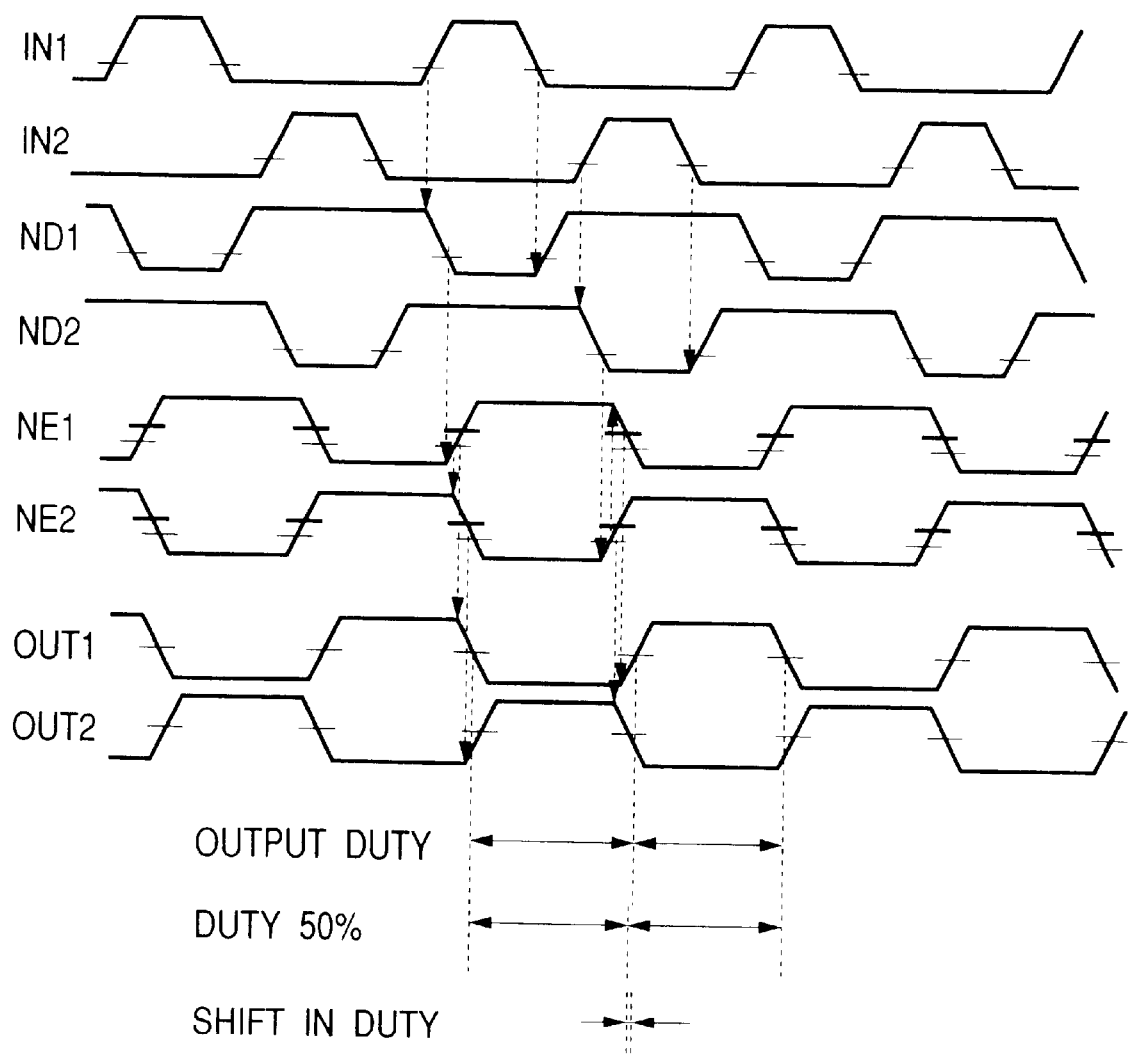
FIG. 26 is an operation waveform diagram of the circuit shown in FIG. 25.

Even in the case of the example shown in FIG. 25, the NAND gates in which the logic threshold voltages are shifted, have a tendency that the difference between tpLH and tpHL changes and increases dependently on a load in particular. Therefore, CMOS inverters 66 may receive outputs NE1 and NE2 of the NAND gates 42A and 43A therein and send them to a subsequent stage in a manner similar to the above example. A waveform diagram at this time is illustrated in FIG. 26. Setting high the logic threshold voltages of the NAND gates 40A through 43A reduces a duty shift.

The description of the method of correcting the duty shift corresponding to the delay time of one gate has been effected on the duty correction circuit 5 based on the NAND gates above. It is however apparent that a similar effect is obtained by reversing the polarity and an increase and decrease in logic threshold voltage respectively even with respect to such a NOR gate-based duty correction circuit 5 as shown in FIG. 15, for example.

<<Duty Correction Circuit Using the Extraction of Short Pulse Period>>

Figure 27:
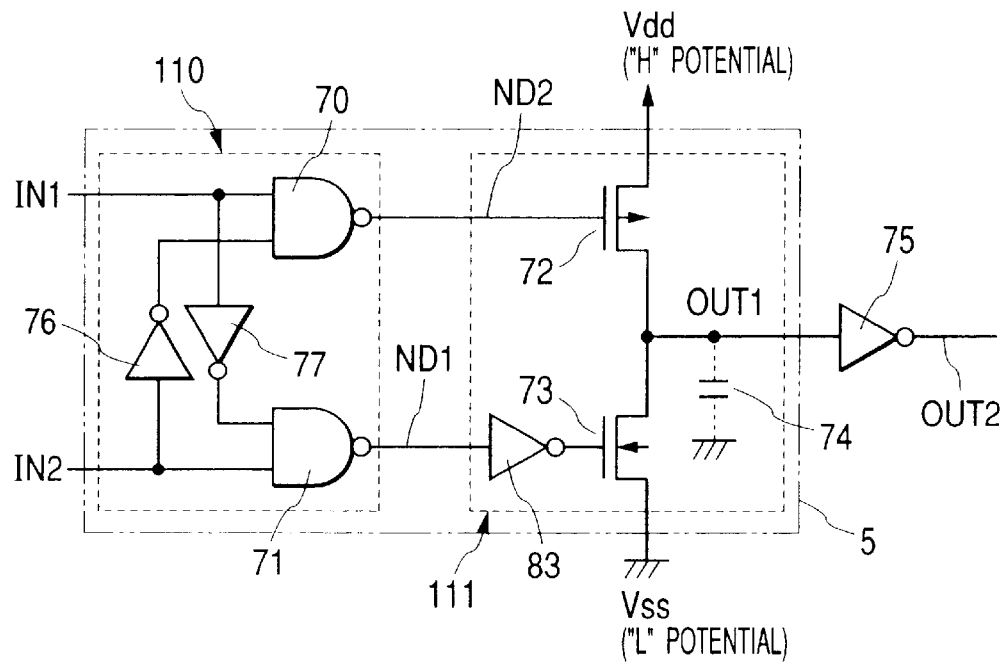
FIG. 27 is a circuit diagram illustrating a duty correction circuit using transfer gates.

FIG. 27 illustrates a duty correction circuit using transfer gates. The duty correction circuit 5 shown in the same drawing has a first NAND gate 70 which receives one IN1 of complementary clock signals having a phase difference of 180° therebetween and an inverted signal of the other IN2 thereof therein, a second NAND gate 71 which receives the other IN2 of the complementary clock signals having the phase difference of 180° therebetween and an inverted signal of the one IN1 thereof therein, a p channel MOS transistor 72 switch-controlled by the output of the first NAND gate 70 and connected to a source voltage Vdd and an output terminal OUT1, and a second conduction type second transistor 73 switch-controlled by an inverted signal of the output of the second NAND gate 71 and connected to a circuit's ground voltage Vss and the output terminal OUT1. A capacitor 74 is connected to the output terminal OUT1. The capacitor 74 may be parasitic capacitance of a wiring or an input gate of a next-stage inverter 75. A signal at the output terminal OUT1 is amplified by the inverter 75, which in turn is outputted as an inverted signal OUT2. Reference numerals 76, 77 and 83 indicate inverters respectively.

The duty correction circuit shown in FIG. 27 can be grasped or taken as a first logic stage 110 and a second logic stage 111. The first logic stage 110 performs a logic operation for determining a duty ratio between the complementary clock signals IN1 and IN2, maintaining an "L" period so as to be shorter than a duty ratio of about 50% with respect to complementary clock signals having a duty ratio set so as to be shorter than an "L" period at a duty ratio at which an "L" period is about 50% and correcting an "L" period so as to be shorter than a duty ratio of about 50% with respect to complementary clock signals having a duty ratio set so as to be longer than an "L" period at the duty ratio at which the "L" period is about 50%. The second logic stage 111 receives the complementary clock signals outputted from the first logic stage 110 therein, effects a correction for setting the duty ratio to about 50% thereon and produces an output therefrom.

Figure 28:
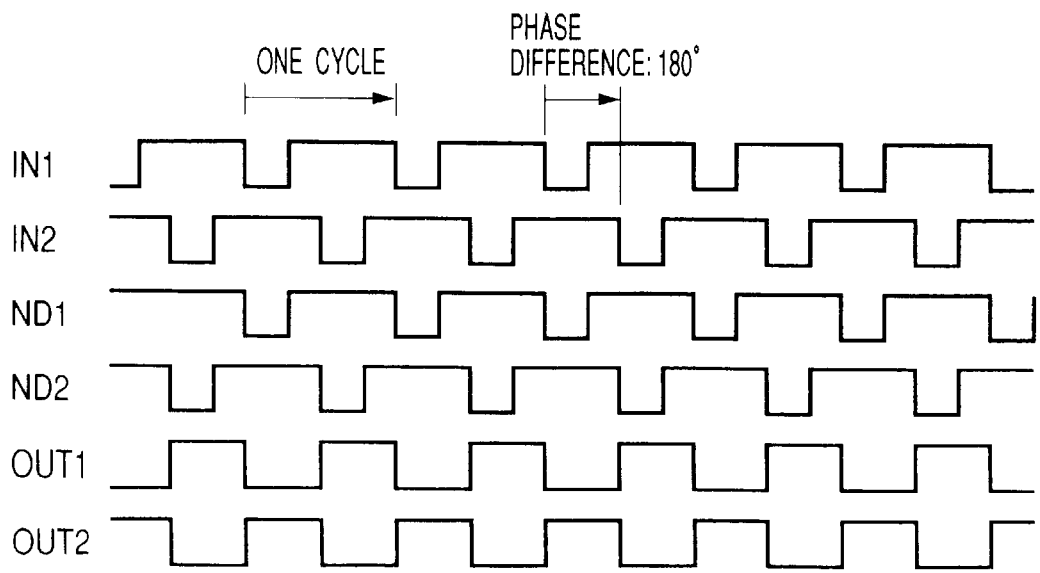
FIG. 28 is an operation waveform diagram at the time that complementary clock signals each having a long "H" period are supplied to the duty correction circuit shown in FIG. 27.
Figure 29:
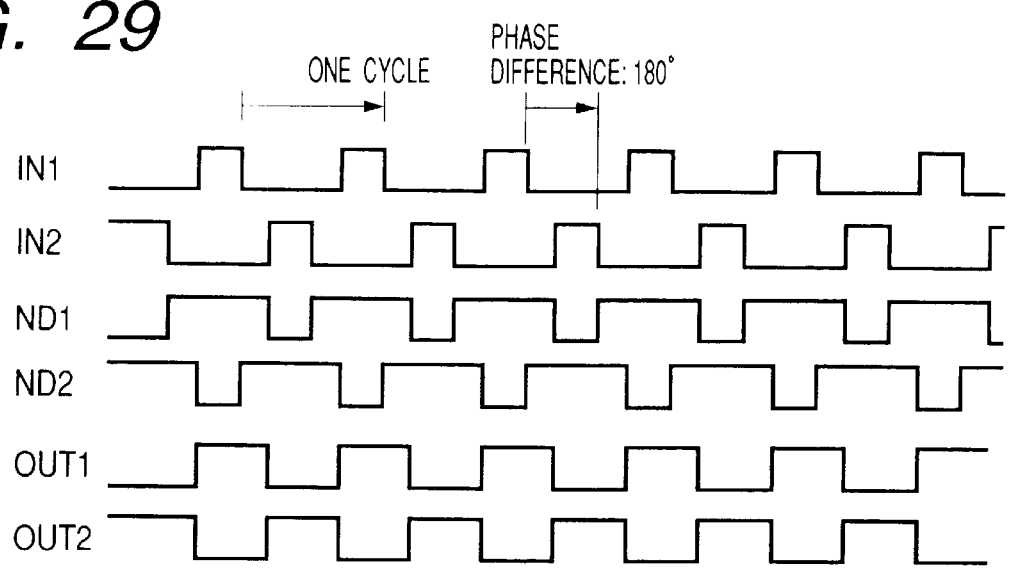
FIG. 29 is an operation waveform diagram at the time that complementary clock signals each having a long "L" period are supplied to the duty correction circuit shown in FIG. 27.

FIG. 28 shows operating waveforms at the time that complementary clock signals whose "H" periods are long, are supplied to the duty correction circuit 5 shown in FIG. 27. FIG. 29 shows operating waveforms at the time that complementary clock signals whose "L" periods are long, are supplied to the duty correction circuit 5 shown in FIG. 27. As apparent from those operating waveforms, the duty correction circuit 5 shown in the same drawing outputs signals in which short periods of the complementary clock signals IN1 and IN2 are defined as "L" periods, to their corresponding nodes ND1 and ND2 through the NAND gates 70 and 71. Thus, the transistors 72 and 73 are alternately switch-controlled without the overlapping of on operation periods. Although the two transistors 72 and 73 are both placed during an off period, the capacitor (including parasitic capacitance) 74 is capable of holding an output state. Thus, a clock signal OUT2 having a duty ratio of about 50% can be obtained. In the present example in particular, an output OUT1 is amplified by the inverter 75 in consideration of the load on the next stage.

Figure 30:
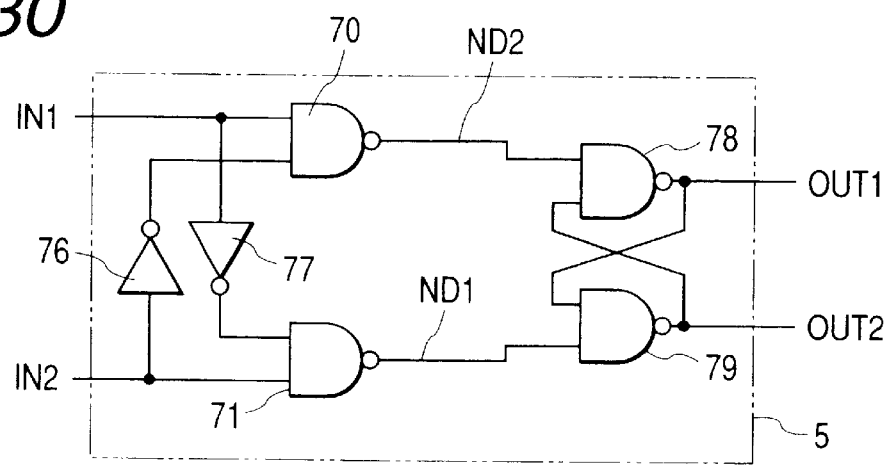
FIG. 30 is a logic circuit diagram of a duty correction circuit having adopted a NAND latch circuit in place of the transfer gates shown in FIG. 22.

FIG. 30 shows another circuit for extracting each short pulse period to thereby perform a duty correction. The duty correction circuit shown in the same drawing comprises a NAND latch circuit substituted for the MOS transistors 72 and 73 shown in FIG. 27. The NAND latch circuit is configured in such a manner that one inputs of two-input NAND gates 78 and 79 are cross-connected to the other outputs thereof. Even in the case of the present configuration, NAND gates 70 and 71 output signals in which short periods of complementary clock signals IN1 and IN2 are set as "L" periods, to their corresponding nodes ND1 and ND2. The outputs are latched in the NAND latch circuit comprised of the NAND gates 78 and 79, from which outputs OUT1 and OUT2 are formed. Output waveforms are similar to FIGS. 28 and 29.

Incidentally, when the configurations shown in FIGS. 27 and 30 are compared with those of the duty correction circuits shown in FIGS. 1 and 15, a circuit scale slightly increases and pulse widths at ND1 and ND2 become thin by the provision of the inverters 76 and 77. Thus, the duty correction circuits shown in FIGS. 1 and 15 are considered to be excellent in terms of the maximum operating frequency.

<<Other Duty Correction Circuits>>

Figure 31:
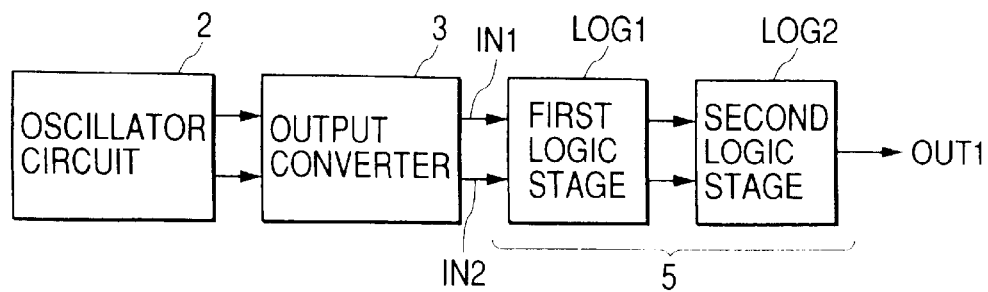
FIG. 31 is a block diagram showing the configuration of a duty correction circuit on a dominant conception basis.

The duty correction circuits 5 described above can be regarded as specific examples included in a conceptual configuration shown in FIG. 31. Namely, an oscillator circuit has a phase difference of about 180° and a duty ratio of about 50% owing to a differential configuration. Waveforms IN1 and IN2 outputted from an output converter are digital signals respectively. The waveforms of IN1 and IN2 are differential outputs and digital, and the phase difference is held at about 180°. However, the duty ratio might be shifted from about 50% by an output converter 3. The duty correction circuit 5 outputs a signal having a duty of about 50% to one output OUT1 from the same transitional edges of the differential signals IN1 and IN2 having a phase difference of 180° therebetween. The forms or modes of outputs are as follows. (1) The OUT1 rises at the rising edge of the IN1 and the OUT1 falls at the same rising edge of the IN2. (2) The OUT1 rises at the falling edge of the IN1 and the OUT1 falls at the same falling edge of the IN2. (3) The OUT1 falls at the rising edge of the IN1 and the OUT1 rises at the same rising edge of the IN2. (4) The OUT1 falls at the falling edge of the IN1 and the OUT1 rises at the same falling edge of the IN2. A duty correcting operation is carried out in any mode. Further, the duty correcting operation is performed even if the duty for the IN1 and IN2 is 50% or more or less. At this time, the duty correcting operation is performed according to only levels from the IN1 and IN2 inputs and logic operations from timings without outputting narrow or thin pulses equivalent to derivative waveforms due to internal small delays at the edges of the IN1 and IN2. A first logic stage LOGS determines whether the duty is long, and converts it to 50% or less when it is found to be long. A second logic stage outputs a duty 50% from waveforms of 50% or less.

Here, whether or not the duty for the IN1 and IN2 is "long", means whether ""L" is long" where the post-stage second logic stage LOG2 starts to operate, based on the transition to "L" as in the case of the NAND gate-based configuration as shown in FIG. 1. When the post-stage second logic stage LOG2 starts to operate, based on the transition to "H" as in the case of the NOR gate-based configuration as shown in FIG. 15, it means whether ""H" is long". Even in the case of the configuration using the transfer gates, it means whether ""L" is long" with respect to a p channel MOS transistor made active at "L". Further, it means whether ""H" is long" with respect to an n channel MOS transistor made active at "H".

It is needless to say that the duty correction circuit 5, which comprises the first logic stage LOG1 and the second logic stage LOG2, can be implemented even by other than the above-described configuration typified by the serial two-stage configuration of NAND latch circuits.

Figure 32:
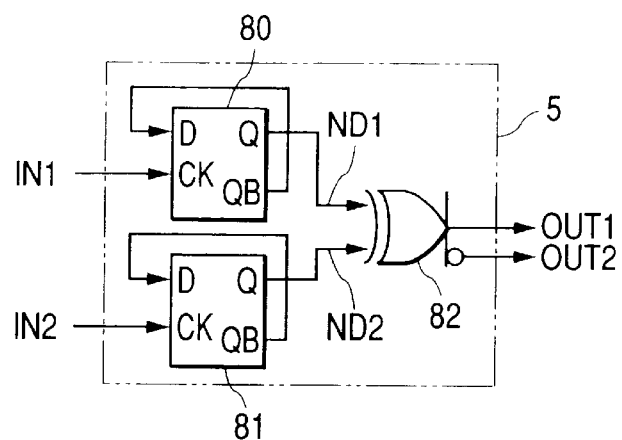
FIG. 32 is a logic circuit diagram showing a further circuit of the duty correction circuit.
Figure 33:
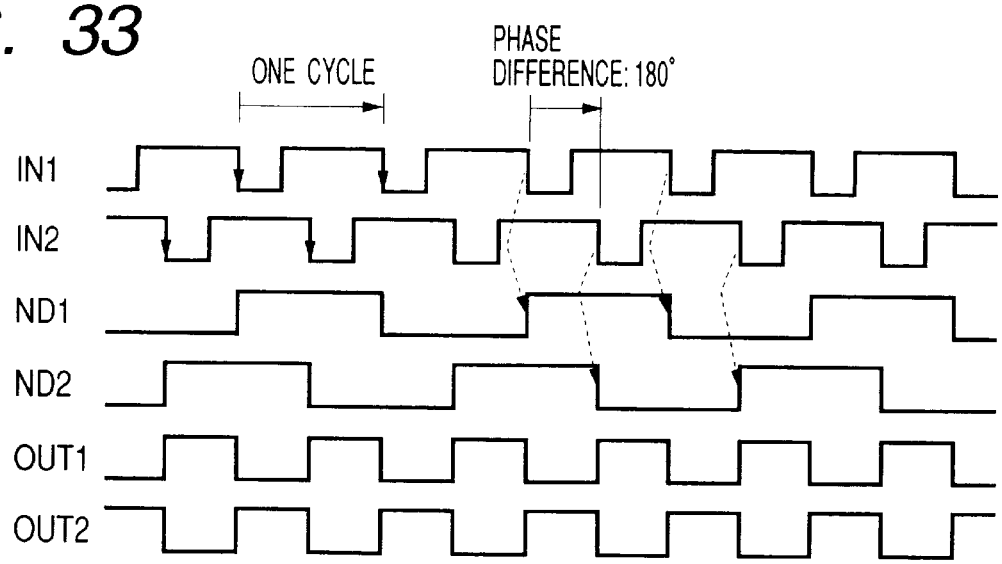
FIG. 33 is an operation waveform diagram of the duty correction circuit shown in FIG. 32.

FIG. 32 shows an example of a further duty correction circuit. The duty correction circuit 5 shown in the same drawing comprises D-type flip-flop circuits 80 and 81 and an exclusively OR/NOR gate (XOR logical sum/negative logical sum) 82. Complementary clock signals IN1 and IN2 are respectively supplied to clock terminals CK of the latch circuits 80 and 81. In synchronism with the falling edges, 2-divided signals of the input IN1 and IN2 are respectively outputted to nodes ND1 and ND2 from data terminals Q and Q. The exclusively OR/NOR gate 82 determines the coincidence/non-coincidence as to the signals at the nodes ND1 and ND2. If they are found to be non-coincident, then "H" is outputted as an output OUT1. If they are found to be coincident, then "L" is outputted as an output OUT1. If they are found to be non-coincident, then "L" is outputted as an output OUT2. If they are found to be coincident, then "H" is outputted as an output OUT2. FIG. 33 illustrates operating waveforms of the duty correction circuit shown in FIG. 32. As obvious from the waveform diagram, outputs OUT1 and OUT2 having a duty ratio of about 50% can be obtained with respect to inputs IN1 and IN2 with a duty shift or deviation defined therebetween. However, there is also a high danger that since the two flip-flops 80 and 81 are used, a circuit scale increases and a duty shift remains with a relatively rate due to the difference in internal operation delay between the pair of flip-flops.

<<System Applied to Duty Correction Circuit>

Figure 34:
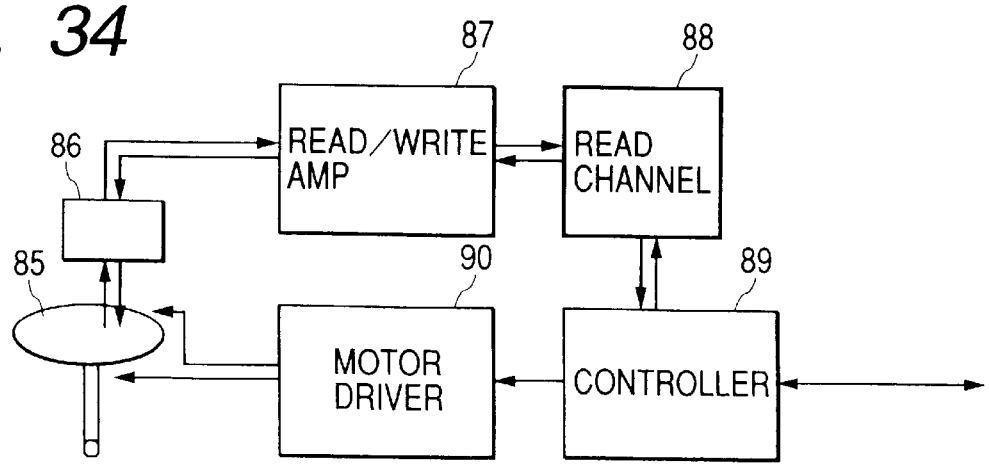
FIG. 34 is a block diagram of an optical disc system.

A block diagram of an optical disc system is schematically shown in FIG. 34. Information recorded in a disc 85 is read by a pickup 86. The read signal is amplified by a read/write amplifier 87, followed by supply to a read channel 88 as a high-frequency signal. Data decoded by the read channel 88 is supplied to a host system through a controller 89. In the writable optical disc system, write data supplied from the host system to the controller 89 is encoded by the read channel 88. The read/write amplifier 87 drives the pickup 86 to write the write data into the disc 85. The controller 89 controls a read operation in response to a read command supplied from the host system and controls a write operation in response to a write command supplied from the host system. A motor driver 90 performs rotational driving of the disc 85 and tracking driving of the pickup 86.

Figure 35:
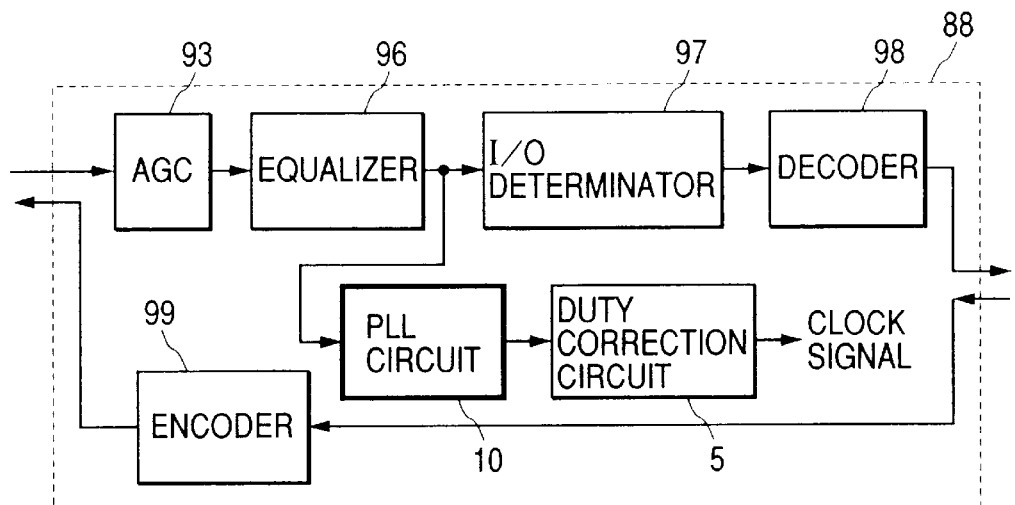
FIG. 35 is a block diagram showing one example of a read channel.

FIG. 35 shows one example of the read channel 88. A high-frequency signal from the read/write amplifier 87 is gain-controlled by an auto gain controller (AGC) 93 and equalized by an equalizer 96. A determinator 97 makes a decision as to whether data is "1" or "0". As a 1/0 detection system of the determinator 97, there are known several systems such as level detection, peak detection, VITREBI decoding, etc. according to applications. A decoder 98 effects record information decoding on the result of decision. The decoded data is supplied to the host system. Write data supplied from the host system is encoded to a predetermined format by an encoder 99, followed by supply to the read/write amplifier 87. The read channel 88 is formed on, for example, a single semiconductor substrate and brought into semiconductor integrated circuit form. An internal operation of the read channel 88 is synchronized with a clock signal. A PLL circuit 10 for generating the clock signal is provided. The PLL circuit 10 inputs the output of the equalizer 96 and reproduces a synchronous clock signal. The PLL circuit 10 has a configuration shown in FIG. 36 by way example. The output converter 3 is provided at the final stage of the PLL circuit 10. The duty correction circuit 5 is placed to correct a duty shift developed by the output converter 3. The read channel 88 is activated with a clock signal outputted from the duty correction circuit 5 as a reference clock signal.

Figure 36:
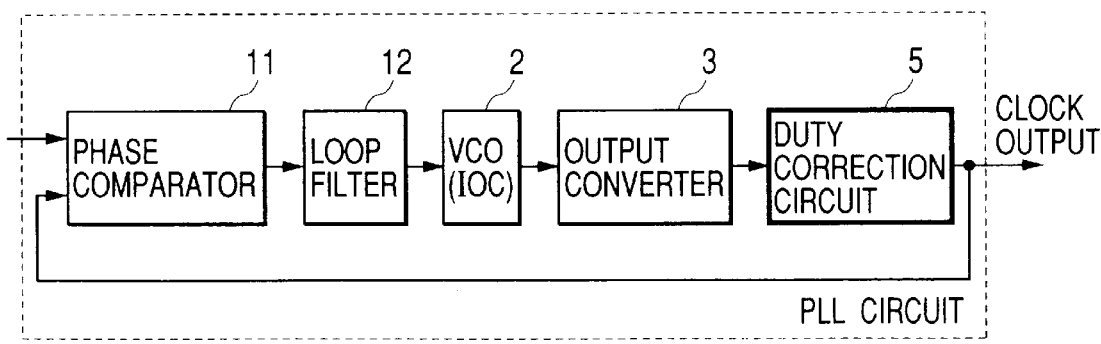
FIG. 36 is a block diagram depicting a PLL circuit of such a type that the output of a duty correction circuit is fed back to a phase comparator.

The feedback signal in the PLL circuit 10 is set as the output of VCO or the output of the output converter 3 or the like as described in FIG. 2 and the like. However, the semiconductor integrated circuit to which the duty correction circuit 5 according to the present invention is applied, normally takes such a configuration that the output of the duty correction circuit 5 is fed back to a phase comparator 11 as illustrated in FIG. 36. Alternatively, the output is subjected to logic processing by a stage subsequent to the duty correction circuit 5 and thereafter it may be fed back to the phase comparator 11.

The optical disc system may be a DVD (Digital Video Disc) device, a CD-ROM (Compact Disc-ROM) device or the like. Further, the configuration shown in FIGS. 34 through 36 can be adopted even for a magnetic disk unit like an HDD (Hard Disk Drive) device. In the HDD device, a so-called PRML system for making a decision as to "1" or "0" according to a VITERBI decoding process in place of the peak detection has been in the mainstream in recent years. Here, an AD converter (not shown) is placed at a stage preceding the equalizer 96, and the equalizer 96 is implemented by a digital circuit in most cases. The present system can be applied similarly even to data communications for a fast LAN (Local Network) or the like. Further, the duty correction circuit is not limited to the read channel and can be applied even to a CPU (Central Processing Unit), an MPU (Microprocessor Unit) and a DSP (Digital Signal Processor).

Each of the optical disc system and the magnetic disc unit can obtain an effect in that the ability to set high a signal frequency or an operating frequency for the purpose of speeding up a data read rate and reduce a duty shift from 50% between complementary clock signals in such an application field makes it possible to enhance the reliability of operations such as a data reproducing operation, etc. and cope with a further speedup.

Figure 37:
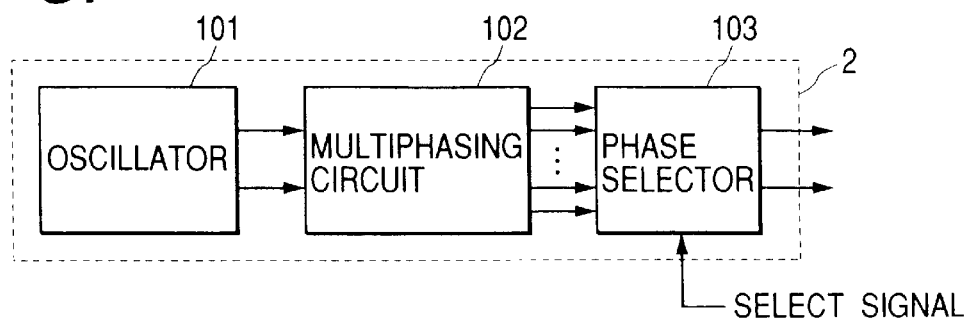
FIG. 37 is a block diagram illustrating an oscillator circuit substitutable for VCO according to the function of selectively outputting multiphase clock signals.

The oscillator circuit 2 like VCO is not limited to such a configuration as shown in FIG. 4. As illustrated in FIG. 37, the oscillator circuit 2 can also be implemented by a circuit configuration having no feedback system directly to an oscillator 101. An oscillator circuit 2 shown in FIG. 37 comprises the oscillator 101, a multiphasing circuit 102, and a phase selector 103. When the multiphasing circuit 102 is configured in eight phases, the phase differences among respective phases (0), (1), . . . (7) result in 360/n° per phase where the number of phases is n. Thus, multiphasic clock signals shown in FIG. 38 by way of example are produced. In the example shown in FIG. 38, the phase subsequent to the phase (7) results in the phase (0). When the circuit takes a differential configuration, reversed phases of the phases (0), (1), (2) and (3) may be outputted as the phases (4), (5), (6) and (7). If a signal having the phase (0) is continuously outputted as illustrated in FIG. 38(A) by way of example, then the frequency thereof remains at f0. If the same phases are continuously outputted even in the case of other phases (1) through (7), then the frequencies thereof remain at f0 in the same manner. If a clock signal is continuously outputted so that the phases are placed in order of (0) (0), (1) (1), . . . (7) (7), (0) (0) . . . as illustrated in FIG. 38(B), then the frequency results in f0/(1 30 1/(2*n))[n=8]. A symbol*indicates a multiplication sign. If the order of continuously outputting the phases is stationary, then the frequency is also constant. However, the clock signal has jitter in peak-to-peak of 360/n°. This results from the quantization of each phase.

The configuration of FIG. 37 has a function defined as VCO by controlling phase selection in real time. Jitter has peak-to-peak jitter components of 360/n° which result from the quantization in any case. There is a jitter component which results from a PLL loop characteristic, in addition to the above. On the contrary, the above configuration has the advantage of little producing a transient response relative to the input of a control voltage to the oscillator circuit. Even when the oscillator circuit 2 (including VCO) described in FIG. 1 and the like is taken as such a configuration as shown in FIG. 37, the duty correction circuit 5 described in FIG. 1 and the like is similarly effective.

When it is hard to make VCO oscillations at a double frequency in a high-speed read channel LSI or the like employed in HDD or DVD to which the above-described duty correction circuit is applied, the duty correction circuit can recover a deviation or shift from a duty ratio of about 50% developed at the output converter 3 for level-converting an analog output of the oscillator circuit 2 to digital form, to a duty ratio of about 50% when it is brought into digital form or immediately before it enters a sequence circuit. Further, a margin for the subsequent duty shift between tpLH and tpHL can be widened and by extension, a higher-speed operation is made possible.

A VCO oscillating frequency is doubled for a fast logic LSI wherein a PLL circuit is used and a VCO oscillating frequency is set twice so that a clock signal outputted from the PLL circuit reaches a duty ratio of about 50%, and the VCO oscillating frequency is divided into two when it is brought into digital form, and the duty correction circuit is added to the logic LSI, whereby the VCO oscillating frequency can be lowered and correspondingly, a higher speedup, lower power consumption, lower EMI radiation, etc. are made possible.

While the invention made above by the present inventors has been described specifically by the embodiments, the present invention is not limited to them. It is needless to say that various changes can be made thereto without the scope not departing from the substance thereof.

For example, the static latch type NAND gate or NOR gate, which constitute the duty correction circuit, are not limited to the two inputs and may be set to three inputs or more. They may be configured so as to share the use of clock control gates by inputting a clock enable signal or the like thereto.

The present invention can be applied even to a configuration in which clock sources such as a PLL circuit, etc. are placed every blocks in a semiconductor integrated circuit. Further, the present invention can widely be applied even to a receiving LSI for communications or LAN, and a data processing LSI such as a microcomputer, DSP, etc. as well as to read channels for storage media applications such as HDD, DVD, etc.

Advantageous effects obtained by typical ones of the inventions disclosed in the present application will be described in brief as follows:

Owing to duty correcting means according to the present invention, a duty ratio for clock signals can easily be recovered to a duty ratio of about 50% corresponding to a desirable state in the neighborhood of a sequence circuit even if the duty ratio for the clock signals breaks down at a logic circuit unit which inputs complementary clock signals and performs a logic operation. Even if the duty ratio for the clock signals increases or decreases from about 50%, the duty ratio can easily be recovered to a state of a desirable about 50%.

When it is hard to make VCO oscillations at a double frequency in a high-speed read channel LSI or the like employed in HDD or DVD to which a duty correction circuit is applied, the duty correction circuit can recover a deviation or shift from a duty ratio of about 50% developed at an output converter for converting an analog output of an analog oscillator circuit to a digital signal, to a duty ratio of about 50% at a subsequent-stage portion placed immediately before it enters a sequence circuit, for example. Further, a margin for the subsequent duty shift between tpLH and tpHL can be widened and by extension, a higher-speed operation is made possible. A PLL circuit or the like needs not to use such a means that a VCO oscillating frequency is set twice and divided into two at a subsequent stage. Further, the VCO oscillating frequency is doubled and the duty correction circuit is added thereto, whereby the VCO oscillating frequency can be lowered and correspondingly, a higher speedup, lower power consumption, lower EMI radiation, etc. are made possible.

What is claimed is:

1. A semiconductor integrated circuit comprising:

an oscillator circuit which generates complementary cycle signals being of a phase difference of about half cycle therebetween and being of a duty ratio of about 50%;

an output converter which converts the complementary cycle signals outputted from said oscillator circuit to predetermined logic levels and outputs complementary clock signals being of a phase difference of about half cycle therebetween; and a logic circuit unit which inputs the complementary clock signals outputted from said output converter and performs a logic operation, wherein said logic circuit unit includes a duty correction circuit which corrects at least a duty shift between the complementary clock signals, which is developed at said output converter, and recovers the same to about 50%, and wherein said duty correction circuit includes a first logic stage which inputs the complementary clock signals having passed said output converter, and a second logic stage which inputs the output of said first logic stage, wherein said first logic stage performs a logic operation for correcting complementary clock signals being of a duty ratio set to be shorter than a period for a first logical value at a duty ratio at which the period for the first logical value is about 50%, to a duty ratio of about 50%, and correcting the period for the first logical value so as to be shorter than the duty ratio of about 50% with respect to complementary clock signals being of a duty ratio set to be longer than the period for the first logical value at the duty ratio at which the period for the first logical value is about 50%, and wherein said second logic stage inputs complementary clock signals outputted from said first logic stage, corrects complementary clock signals being of a duty ratio set to be shorter than the period for the first logical value at a duty ratio at which the period for the first logical value is about 50%, to a duty ratio of about 50%, effects logical value inversion on complementary clock signals whose duty ratio is about 50%, and produces an output therefrom.

2. A semiconductor integrated circuit comprising:

an oscillator circuit which generates complementary cycle signals being of a phase difference of about half cycle therebetween and being of a duty ratio of about 50%;

an output converter which converts the complementary cycle signals outputted from said oscillator circuit to predetermined logic levels and outputs complementary clock signals being of a phase difference of about half cycle therebetween; and a logic circuit unit which inputs the complementary clock signals outputted from said output converter and performs a logic operation, wherein said logic circuit unit includes a duty correction circuit which corrects at least a duty shift between the complementary clock signals, which is developed at said output converter, and recovers the same to about 50%, and wherein said duty correction circuit includes:

a first latch circuit wherein the outputs of one NAND gates are respectively mutually feedback-connected to inputs of the other NAND gates, and complementary clock signals being of the phase difference of about half cycle are supplied to the other inputs of the respective NAND gates, and a second latch circuit wherein the outputs of one NAND gates are respectively mutually feedback-connected to inputs of the other NAND gates, and the outputs of the NAND gates of the first latch circuit are respectively supplied to the other inputs of the respective NAND gates.

3. A semiconductor integrated circuit comprising:

an oscillator circuit which generates complementary cycle signals being of a phase difference of about half cycle therebetween and being of a duty ratio of about 50%;

an output converter which converts the complementary cycle signals outputted from said oscillator circuit to predetermined logic levels and outputs complementary clock signals being of a phase difference of about half cycle therebetween; and a logic circuit unit which inputs the complementary clock signals outputted from said output converter and performs a logic operation, wherein said logic circuit unit includes a duty correction circuit which corrects at least a duty shift between the complementary clock signals, which is developed at said output converter, and recovers the same to about 50%, and wherein said duty correction circuit includes:

a first latch circuit wherein the outputs of one NOR gates are respectively mutually feedback-connected to inputs of the other NOR gates, and complementary clock signals being of the phase difference of about half cycle are supplied to the other inputs of the respective NOR gates, and a second latch circuit wherein the outputs of one NOR gates are respectively mutually feedback-connected to inputs of the other NOR gates, and the outputs of the NOR gates of the first latch circuit are respectively supplied to the other inputs of the respective NOR gates.

4. The semiconductor integrated circuit according to claim 2, further comprising a plurality of inverters wherein said inverters whose logic threshold voltages are respectively set high from an intermediate level of a source voltage, are connected to the respective outputs of said second latch circuit.

5. The semiconductor integrated circuit according to claim 2, wherein the NAND gates of said first and second latch circuits respectively are set logic threshold voltages lower than an intermediate level of a source voltage.

6. The semiconductor integrated circuit according to claim 3, wherein the NOR gates of said first and second latch circuits respectively are set logic threshold voltages higher than an intermediate level of a source voltage.

7. The semiconductor integrated circuit according to claim 3, further comprising a plurality of inverters wherein said inverters whose logic threshold voltages are respectively set low from an intermediate level of a source voltage, are connected to the respective outputs of said second latch circuit.

8. A semiconductor integrated circuit comprising:

an oscillator circuit which generates complementary cycle signals of a phase difference of about half cycle therebetween and of a duty ratio of about 50%;

an output converter which converts the complementary cycle signals outputted from said oscillator circuit to predetermined logic levels and outputs complementary clock signals of a phase difference of about half cycle therebetween; and a logic circuit unit which inputs the complementary clock signals outputted from said output converter and performs a logic operation, wherein said logic circuit unit includes a duty correction circuit which corrects at least a duty shift between the complementary clock signals, which is developed at said output converter, and recovers the same to about 50%, and wherein said duty correction circuit includes:
  a first logic stage which performs a logic operation for determining a duty ratio for the complementary clock signals, maintaining a period for a first logical value so as to be shorter than a duty ratio of about 50% with respect to complementary clock signals of a duty ratio set to be shorter than the period for the first logical value at the duty ratio at which the period for the first logical value is about 50%, and correcting the period for the first logical value so as to be shorter than the duty ratio of about 50% with respect to complementary clock signals of a duty ratio set to be longer than the period for the first logical value at the duty ratio at which the period for the first logical value is about 50%, and
  a second logic stage which inputs the complementary clock signals outputted from said first logic stage, effects a correction for setting a duty ratio to about 50% thereon and produces an output therefrom.

9. A semiconductor integrated circuit comprising:

an oscillator circuit which generates complementary cycle signals being of a phase difference of about half cycle therebetween and being of a duty ratio of about 50%;

an output converter which converts the to complementary cycle signals outputted from said oscillator circuit to predetermined logic levels and outputs complementary clock signals being of a phase difference of about half cycle therebetween; and a logic circuit unit which inputs the complementary clock signals outputted from said output converter and performs a logic operation, wherein said logic circuit unit includes a duty correction circuit which corrects at least a duty shift between the complementary clock signals, which is developed at said output converter, and recovers the same to about 50%, and wherein said duty correction circuit includes:
  a first NAND gate which inputs one of complementary clock signals being of a phase difference of about half cycle therebetween and an inverted signal of the other thereof,
  a second NAND gate which inputs the other of the complementary clock signals being of the phase difference of about half cycle therebetween and an inverted signal of the one thereof,
  a first conduction type first transistor switch-controlled by the output of the first NAND gate and connected to a source voltage and an output terminal,
  a second conduction type second transistor switch-controlled by an inverted signal of the output of the second NAND gate and connected to a circuit's ground voltage and the output terminal, and
  a capacitor connected to the output terminal.

10. A semiconductor integrated circuit comprising:

an oscillator circuit which generates complementary cycle signals having a phase difference of about half cycle therebetween and having a duty ratio of about 50%;

an output converter which converts the complementary cycle signals outputted from said oscillator circuit to predetermined logic levels and outputs complementary clock signals having a phase difference of about half cycle therebetween; and a logic circuit unit which inputs the complementary clock signals outputted from said output converter and performs a logic operation, wherein said logic circuit unit includes a duty correction circuit which corrects at least a duty shift between the complementary clock signals, which is developed at said output converter, and recovers the same to about 50%, and wherein said duty correction circuit includes:
  a first NAND gate which inputs one of complementary clock signals having a phase difference of about half cycle therebetween and an inverted signal of the other thereof,
  a second NAND gate which inputs the other of the complementary clock signals having the phase difference of about half cycle therebetween and an inverted signal of the one thereof, and
  a latch circuit wherein the output of one NAND gate is mutually feedback-connected to the input of the other NAND gate and the other inputs of the respective NAND gates are respectively supplied with signals outputted from said first and second NAND gates.

11. A semiconductor integrated circuit comprising:

an oscillator circuit which generates complementary cycle signals having a phase difference of about half cycle therebetween and having a duty ratio of about 50%;

an output converter which converts the complementary cycle signals outputted from said oscillator circuit to predetermined logic levels and outputs complementary clock signals having a phase difference of about half cycle therebetween; and a logic circuit unit which inputs the complementary clock signals outputted from said output converter and performs a logic operation, wherein said logic circuit unit includes a duty correction circuit which corrects at least a duty shift between the complementary clock signals, which is developed at said output converter, and recovers the same to about 50%, and wherein said duty correction circuit includes:
  flip-flops which respectively divide complementary clock signals having a phase difference of about half cycle therebetween into two, and
  a logic gate circuit which receives the outputs of said flip-flops as two inputs, brings the clock signals into status changes each time the two inputs coincide or uncoincide, and outputs the state-changed signals therefrom.

12. A semiconductor integrated circuit comprising:

an oscillator circuit which generates complementary cycle signals having a phase difference of about half cycle therebetween and having a duty ratio of about 50%;

an output converter which converts the complementary cycle signals outputted from said oscillator circuit to predetermined logic levels and outputs complementary clock signals having a phase difference of about half cycle therebetween; and a logic circuit unit which inputs the complementary clock signals outputted from said output converter and performs a logic operation, wherein said logic circuit unit includes a duty correction circuit which corrects at least a duty shift between the complementary clock signals, which is developed at said output converter, and recovers the same to about 50%, and wherein said duty correction circuit includes a first logic stage which inputs the complementary clock signals having passed said output converter, and a second logic stage which inputs the output of said first logic stage, wherein said first logic stage performs a logic operation for determining a duty ratio for the complementary clock signals, correcting complementary clock signals of a duty ratio set to be shorter than a period for a first logical value at a duty ratio at which the period for the first logical value is about 50%, to a duty ratio of about 50% or maintaining the period for the first logical value so as to be shorter than the duty ratio of about 50%, and correcting the period for the first logical value so as to be shorter than the duty ratio of about 50% with respect to complementary clock signals of a duty ratio set to be longer than the period for the first logical value at the duty ratio at which the period for the first logical value is about 50%, and wherein said second logic stage inputs complementary clock signals outputted from said first logic stage, brings a duty ratio thereof to about 50% and produces an output therefrom.

13. The semiconductor integrated circuit according to claim 2, wherein the inputs of said first latch circuit are respectively supplied with the complementary clocks signals being of the phase difference of about half cycle therebetween through clock control logic circuits.

14. The semiconductor integrated circuit according to claim 3, wherein the inputs of said first latch circuit are respectively supplied with the complementary clock signals being of the phase difference of about half cycle therebetween through clock control logic circuits.

15. The semiconductor integrated circuit according to claim 1, wherein said oscillator circuit is a voltage-controlled oscillator of a PLL circuit.

16. The semiconductor integrated circuit according to claim 2, wherein said oscillator circuit is a voltage-controlled oscillator of a PLL circuit.

17. The semiconductor integrated circuit according to claim 3, wherein said oscillator circuit is a voltage-controlled oscillator of a PLL circuit.

18. The semiconductor integrated circuit according to claim 8, wherein said oscillator circuit is a voltage-controlled oscillator of a PLL circuit.

19. The semiconductor integrated circuit according to claim 9, wherein said oscillator circuit is a voltage-controlled oscillator of a PLL circuit.

20. The semiconductor integrated circuit according to claim 10, wherein said oscillator circuit is a voltage-controlled oscillator of a PLL circuit.

21. The semiconductor integrated circuit according to claim 11, wherein said oscillator circuit is a voltage-controlled oscillator of a PLL circuit.

22. The semiconductor integrated circuit according to claim 12, wherein said oscillator circuit is a voltage-controlled oscillator of a PLL circuit.

* * * * *